US008687746B2

(12) United States Patent
Cui et al.

(10) Patent No.: US 8,687,746 B2
(45) Date of Patent: Apr. 1, 2014

(54) SMU ARCHITECTURE FOR TURBO DECODER

(75) Inventors: Zhiqiang Cui, San Diego, CA (US); Iwen Yao, San Diego, CA (US); Qiang Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 644 days.

(21) Appl. No.: 12/788,543

(22) Filed: May 27, 2010

(65) Prior Publication Data

US 2011/0292849 A1 Dec. 1, 2011

(51) Int. Cl.
*H04L 27/06* (2006.01)
*H03D 1/00* (2006.01)

(52) U.S. Cl.
USPC ............ 375/341; 375/316; 714/792; 714/794

(58) Field of Classification Search
USPC .................. 375/316, 341; 714/792, 794, 796
See application file for complete search history.

(56) References Cited

U.S. PATENT DOCUMENTS

| | | | | |
|---|---|---|---|---|
| 6,148,431 A | * | 11/2000 | Lee et al. ...................... | 714/794 |
| 2005/0066259 A1 | * | 3/2005 | Park et al. .................... | 714/795 |
| 2005/0120287 A1 | * | 6/2005 | Wu et al. ...................... | 714/795 |
| 2005/0278603 A1 | * | 12/2005 | Berens et al. ................. | 714/755 |
| 2009/0041166 A1 | * | 2/2009 | Patel et al. .................... | 375/341 |
| 2009/0094505 A1 | * | 4/2009 | Nguyen ........................ | 714/780 |
| 2009/0119570 A1 | * | 5/2009 | Eder et al. .................... | 714/792 |

FOREIGN PATENT DOCUMENTS

| | | |
|---|---|---|
| EP | 1394953 A2 | 3/2004 |
| EP | 1424782 A2 | 6/2004 |

OTHER PUBLICATIONS

Bickerstaff M et al: "A 24Mb/s radix-4 LogMAP turbo decoder for 3GPP-HSDPA mobile wireless", Regular Paper ISSCC, Feb. 9, 2003, pp. 1-10, XP010661378.
El-Assal M et al: "A high speed architecture for map decoder", Signal Processing Systems, 2002. (SIPS '02). IEEE Workshop on Oct. 16-18, 2002, Piscataway, NJ, USA,IEEE, Oct. 16, 2002, pp. 69-74, XP010616579.
International Search Report and Written Opinion—PCT/US2011/038267, International Search Authority—European Patent Office—Aug. 18, 2011.
Raghupathy A et al: "A transformation for computational latency reduction in turbo-MAP decoding", IEEE Circuits and Systems, IEEE, Orlando, FL, vol. 4, May 30, 1999, pp. 402-405, XP010341252.

* cited by examiner

*Primary Examiner* — Ted Wang
(74) *Attorney, Agent, or Firm* — Ramin Mobarhan

(57) ABSTRACT

Systems, methods, devices, and computer program products are described for Turbo decoding in a wireless communication system. Turbo encoded wireless signals may be received and demodulated, and forwarded to a branch metric calculator. The branch metric calculator may calculate a set of branch metrics for the demodulated signal. A state metric unit may receive the set of branch metrics and a previously calculated set of state metrics. The state metric unit may perform various comparisons of the set of state metrics before the received set of branch metrics is added to a portion of the state metrics identified through the comparisons.

32 Claims, 14 Drawing Sheets

SMU ARCHITECTURE FOR TURBO DECODER

BACKGROUND

The following relates generally to wireless communication, and more specifically to the decoding received wireless communication signals. Wireless communication systems are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, 3GPP Long Term Evolution (LTE) systems, and orthogonal frequency division multiple access (OFDMA) systems.

A Turbo decoder typically is implemented in hardware, and is employed to ensure reliable transmissions in next generation wireless systems. Turbo codes in 3G and 4G wireless systems are often decoded with the Bahl, Cocke, Jelinek and Raviv (BCJR) algorithm because of its excellent decoding performance. In a Turbo decoder, various recursion architectures may be used for the computation of state metrics. This recursion hardware is widely referred as an SMU (state metric unit). It is often the most computationally intensive hardware engine in a demodulator backend. In general, the highest possible clock frequency of a Turbo decoder is determined by a path of an SMU.

In order to increase decoder clock frequency, fast radix-2 and radix-4 SMU architectures have been developed. However, significant computation overhead is introduced in these fast SMUs. For high throughput Turbo decoding, a large number of SMUs operating in parallel may be needed. As a result, the overhead of silicon area and power consumption can be significant. It may, therefore, be beneficial to create alternative designs to improve speed, increase throughput, lower cost, and/or improve power efficiency.

SUMMARY

Systems, methods, devices, and computer program products are described for Turbo decoding in a wireless communication system. Turbo encoded wireless signals may be received and demodulated, and forwarded to a branch metric calculator. The branch metric calculator may calculate a set of branch metrics with the demodulated signal. A state metric unit may receive the set of branch metrics and a previously calculated set of state metrics. The state metric unit may perform various comparisons of the set of state metrics before the received set of branch metrics is added to a portion of the state metrics identified through the comparisons.

An exemplary method for Turbo decoding with state metric computations includes: receiving a set of branch metrics; receiving a set of previously calculated state metrics; comparing a first subset of the received set of state metrics with a second subset of the received set of state metrics; selecting, before the received set of branch metrics is added to the received set of state metrics, the first subset or the second subset responsive to the comparison, the selected subset comprising a first selected subset; and adding one or more subsets of the received set of state metrics to respective subsets of the received set of branch metrics.

Examples of such a method may include one or more of the following features: utilizing the first selected subset to identify which subsets of the received set of state metrics are to be added to the received set of branch metrics, wherein the identified subsets of the received set of state metrics comprise the one or more subsets; utilizing the first selected subset to eliminate subsets of the received set of state metrics from being added to the received set of branch metrics; utilizing, responsive to the selection, the first selected subset as the portion of the received set of state metrics to add to the received set of branch metrics; and/or eliminating an unselected subset as a portion of the of received set of state metrics to add to the received set of branch metrics.

Also or alternatively, examples of the method may include one or more of the following features: comparing a third subset of the received set of state metrics with a fourth subset of the received set of state metrics, and selecting, before the received set of branch metrics is added to the received set of state metrics, a second selected subset from the third subset or the fourth subset responsive to the comparison. In one example, the comparison of the first subset and second subset and the comparison of the third subset and fourth subset occur concurrently. The first selected subset and the second selected subset may be compared; before the received set of branch metrics is added to the received set of state metrics, a third selected subset from the first selected subset or the second selected subset may be selected in response to the comparison. The third selected subset may be used to determine which subsets of the received set of state metrics are to be added to the received set of branch metrics. The first selected subset or the second selected subset may also be eliminated as a portion of the received set of state metrics to add to the received set of branch metrics, the elimination responsive to the selection of the third selected subset. The Turbo decoding may be forward state metric computations using a radix-4 decoder, or be radix-2 state metric computations.

An exemplary apparatus for Turbo decoding with state metric computations includes: a branch metric calculator configured to calculate a set of branch metrics, and a state metric unit, communicatively coupled with the branch metric calculator. The state metric unit may be configured to calculate a set of state metrics; receive the set of branch metrics and the calculated set of state metrics; compare a first subset of the received set of state metrics with a second subset of the received set of state metrics; select, before the received set of branch metrics is added to the received set of calculated state metrics, the first subset or the second subset responsive to the comparison, the selected subset comprising a first selected subset; and add one or more subsets of the received set of state metrics to respective subsets of the received set of branch metrics.

Examples of such an apparatus may include one or more of the following features: wherein the state metric unit is further configured to utilize the first selected subset to determine which subsets of the received set of state metrics are to be added to the received set of branch metrics; and/or, wherein the state metric unit is further configured to utilize the first selected subset to eliminate subsets of the received set of state metrics from consideration for being added to the received set of branch metrics. The state metric unit may be further configured to compare a third subset of the received set of state metrics with a fourth subset of the received set of state metrics and select, before the received set of branch metrics is added to the received set of state metrics, a second selected subset from the third subset or the fourth subset responsive to the comparison. The comparison of the first subset and second subset and the comparison of the third subset and fourth subset may occur concurrently.

The state metric unit may further be configured to compare the first selected subset and the second selected subset and select, before the received set of branch metrics is added to the received set of state metrics, a third selected subset from the first selected subset or the second selected subset responsive to the comparison. The state metric unit may further be configured to utilize the third selected subset to determine which subsets of the received set of state metrics are to be added to respective portions of the received set of branch metrics. The state metric unit may further be configured to utilize the selection of the third selected subset to eliminate a subset of the received set of state metrics from consideration for being added to respective subsets of the received set of branch metrics.

In the state metric unit of the apparatus: a first comparator module may be configured to compare different subsets of the received set of state metrics to identify and select subsets of higher value; a second comparator module may be configured to compare different subsets selected by the first comparator module to identify and select a winning subset of higher value; a look up table (LUT) module may generate normalization metrics; and an adder module to add normalization metrics to respective combinations of the winning subset and the branch metrics, and thereby calculate new state metrics.

The state metric unit may further be configured to utilize the first selected subset to generate forward or reverse state metrics. The apparatus may include a log likelihood calculator, communicatively coupled with the state metric unit, and configured to receive forward and reverse state metrics from the state metric unit to generate soft-decisions for each time index. In one example, the apparatus is an access terminal, and includes a plurality of forward state calculators and a plurality of reverse state calculators; the state metric unit comprises a selected one of the plurality of forward state calculators or reverse state calculators. In one example, the apparatus includes one or more antennas configured to receive a wireless communication signal; a receiver, coupled with the one or more antennas, and configured to digitize the received wireless communication signal, and demodulate the digitized wireless communication signal to generate a series of soft symbols for processing by the branch metric calculator. The apparatus may be a radix-4 decoder or a radix-2 decoder.

An exemplary device for Turbo decoding with state metric computations includes: means for receiving a set of branch metrics; means for receiving a set of previously calculated state metrics; means for comparing a first subset of the received set of state metrics with a second subset of the received set of state metrics; means for selecting, before the received set of branch metrics is added to the received set of state metrics, the first subset or the second subset responsive to the comparison, the selected subset comprising a first selected subset; and means for adding one or more subsets of the received set of state metrics to respective subsets of the received set of branch metrics.

Examples of such an device may include one or more of the following features: means for adding the first selected subset to respective portions of the received set of branch metrics, wherein an unselected subset is eliminated from consideration as a portion of the of received set of state metrics to be added to respective subsets of the received set of branch metrics. The device may be a radix-2 or radix-4 circuit.

The device may include: means for comparing a third subset of the received set of state metrics with a fourth subset of the received set of state metrics; means for selecting, before the received set of branch metrics is added to the received set of state metrics, a second selected subset from the third subset or the fourth subset responsive to the comparison; and means for adding the second selected subset to combined branch metrics of the received set of branch metrics, wherein the unselected third subset or fourth subset is eliminated from consideration as a portion of the of received set of state metrics to be added to the received set of branch metrics. The device may further include: means for comparing the first selected subset and the second selected subset; and means for selecting a third selected subset from the first selected subset or the second selected subset responsive to the comparison.

An exemplary manufacture for Turbo decoding with state metric computations includes a computer program product residing on a processor-readable medium and comprising processor-readable instructions configured to cause a processor to: receive a set of branch metrics; receive a set of previously calculated state metrics; compare a first subset of the received set of state metrics with a second subset of the received set of state metrics; select, before the received set of branch metrics is added to the received set of state metrics, the first subset or the second subset responsive to the comparison, the selected subset comprising a first selected subset; and add one or more subsets of the received set of state metrics to respective subsets of the received set of branch metrics.

The computer program product may include processor-readable instructions configured to cause the processor to: compare a third subset of the received set of state metrics with a fourth subset of the received set of state metrics; select, before the received set of branch metrics is added to the received set of state metrics, a second selected subset from the third subset or the fourth subset responsive to the comparison, compare the first selected subset and the second selected subset; select a third selected subset from the first selected subset or the second selected subset responsive to the comparison; and add the third selected subset to each of a plurality of combined branch metrics of the set of branch metrics, the third selected subset comprising the one or more subsets of the received set of state metrics.

DETAILED DESCRIPTION

Figure 1:
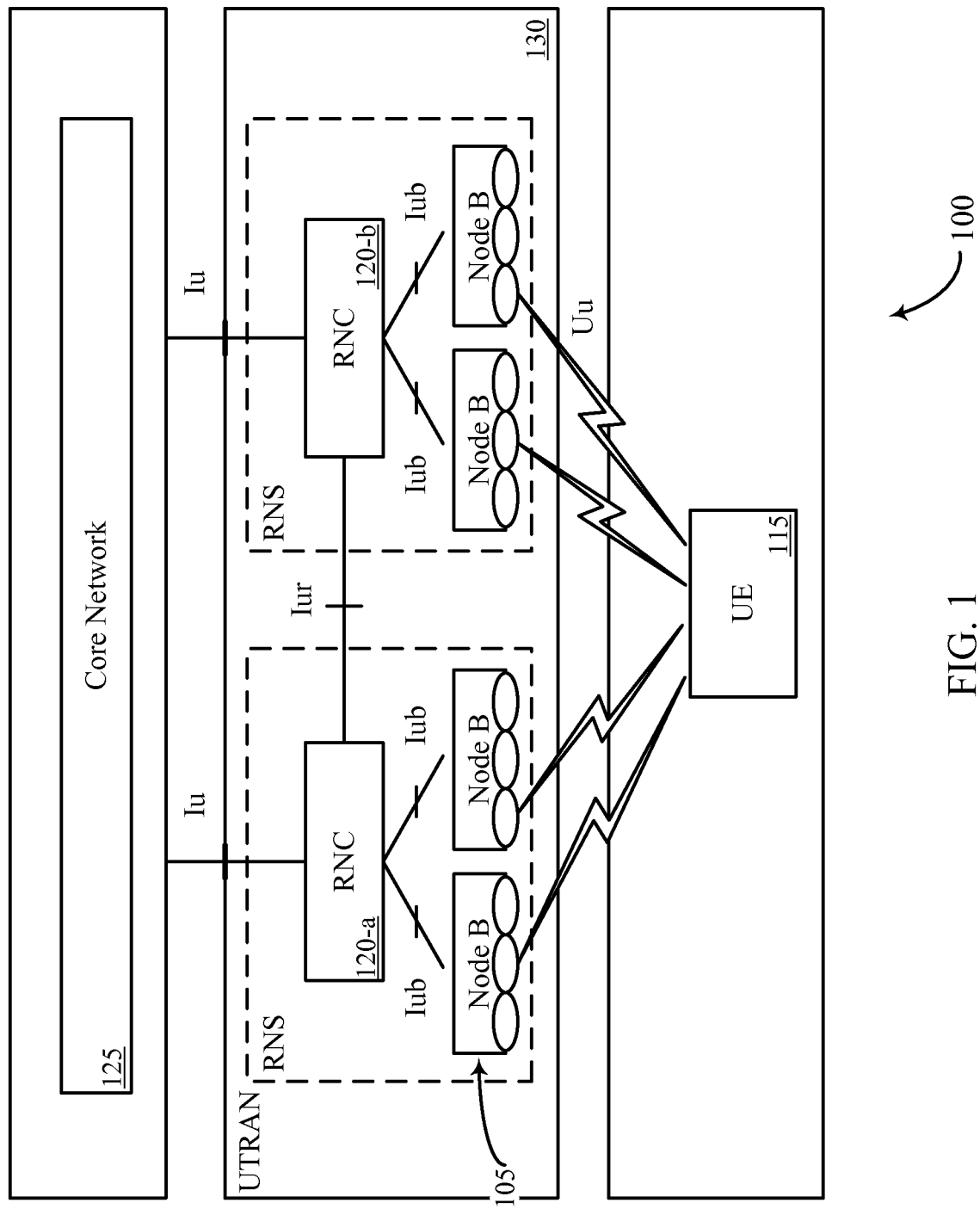
FIG. 1 is a block diagram of a radio access system having two radio network subsystems along with its interfaces to core and user equipment.

Systems, methods, devices, and computer program products are described for Turbo decoding in a wireless communications system. Turbo encoded wireless signals may be received and demodulated before being buffered for decoding. A buffered series of symbols may be forwarded to a branch metric calculator. The branch metric calculator may calculate a set of branch metrics with the demodulated signal. A state metric unit may receive the set of branch metrics and a previously calculated set of state metrics. The state metric unit may perform various comparisons of the set of state metrics before the received set of branch metrics is added to a portion of the state metrics identified through the comparisons. The log-likelihood calculator may generate log-likelihood ratio messages for use in producing the decoded data bits.

Techniques described herein may be used for various wireless communication systems such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1X, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM®, etc. UTRA and E-UTRA are part of Universal Mobile Telecommunication System (UMTS). 3GPP Long Term Evolution (LTE) and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. The description below, however, describes an LTE system for purposes of example, and LTE terminology is used in much of the description below, although the techniques are applicable beyond LTE applications.

Thus, the following description provides examples, and is not limiting of the scope, applicability, or configuration set forth in the claims. Changes may be made in the function and arrangement of elements discussed without departing from the spirit and scope of the disclosure. Various examples may omit, substitute, or add various procedures or components as appropriate. For instance, the methods described may be performed in an order different from that described, and various steps may be added, omitted, or combined. Also, features described with respect to certain examples may be combined in other examples.

Referring first to FIG. 1, a block diagram illustrates an example of a radio network 100. Node Bs 105 and radio network controllers (RNCs) 120 are parts of the radio network 100. In the illustrated example, the radio network includes a UMTS Terrestrial Radio Access Network (UTRAN) 130. In other examples, the Turbo decoder architecture may be used in a variety of different wireless communication networks, as noted above. A UTRAN 130 is a collective term for the Node Bs 105 (or base stations) and the control equipment for the Node Bs 105 (or RNC 120) it contains which make up the UMTS radio access network. This is a 3G communications network which can carry both real-time circuit switched and IP-based packet-switched traffic types. The UTRAN 130 provides an air interface access method for the user equipment (UE) 115. Connectivity is provided between the UE 115 and the core network 125 by the UTRAN 130. The radio network 100 may transport data packets to multiple UEs 115.

The UTRAN 130 is connected internally or externally to other functional entities by four interfaces: Iu, Uu, Iub and Iur. The UTRAN 130 is attached to a GSM core network 125 via an external interface called Iu. RNCs 120 support this interface. In addition, the RNCs 120 manage a set of base stations called Node Bs 105, through interfaces labeled Iub. The Iur interface connects the two RNCs 120-a, 120-b with each other. The UTRAN 130 is largely autonomous from the core network 125 since the RNCs 120 are interconnected by the Iur interface. FIG. 1 discloses a communication system which uses the RNC 120, the Node Bs 105 and the Iu and Uu interfaces. The Uu is also external and connects the Node Bs 105 with the UE 115, while the Iub is an internal interface connecting the RNCs 120 with the Node Bs 105.

The radio network 100 may be further connected to additional networks outside the radio network 100, such as a corporate intranet, the Internet, or a conventional public switched telephone network as stated above, and may transport data packets between each UE device 115 and such outside networks.

Figure 2:
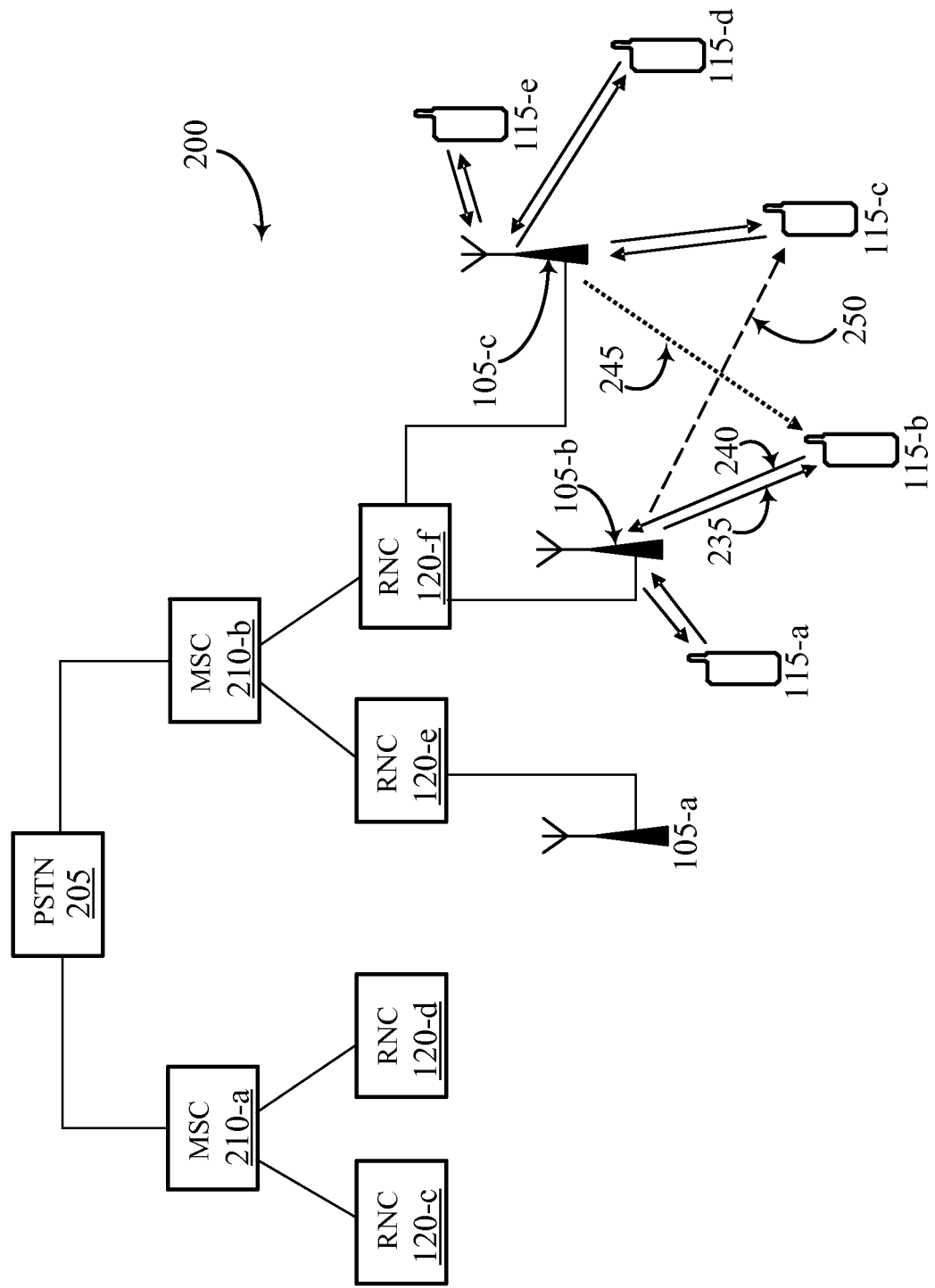
FIG. 2 is a simplified representation of a cellular communication system.

FIG. 2 illustrates selected components of a communication network 200. Communication network 200 includes RNCs 120 coupled to Node Bs 105. The Node Bs 105 communicate with UEs 115 through corresponding wireless connections 235, 240, 245, 250. As described above, a communications channel includes a forward link (also known as a downlink) 235 for transmissions from the Node Bs 105 to the UE 115, and a reverse link (also known as an uplink) 240 for transmissions from the UE 115 to the Node Bs 105. There may be multiple downlink carriers. Each UE 115 may measure or otherwise estimate the channel quality on each downlink carrier. Each UE 115 may transmit this estimated channel quality information to a Node B 105 in the manner described below.

The RNCs 120 provide control functionalities for one or more Node Bs 105. The RNCs 120 are in communication with a public switched telephone network (PSTN) 205 through mobile switching centers (MSCs) 210. In another example, the RNCs 120 are in communication with a packet switched network (PSN) (not shown) through a packet data server node (PDSN) (not shown). Data interchange between various network elements, such as the RNCs 120 and a packet data server node, can be implemented using any number of protocols, for example, the Internet Protocol (IP), an asynchronous transfer mode (ATM) protocol, T1, E1, frame relay, or other protocols.

Each RNC 120 fills multiple roles. First, it may control the admission of new UEs 115 or services attempting to use the Node B 105. Second, from the Node B 105, or base station, point of view, the RNC 120 is a controlling RNC 120. Controlling admission ensures that UEs 115 are allocated radio resources (bandwidth and signal/noise ratio) up to what the network has available. The RNC 120 is where the Node B's 105 Iub interface terminates. From the UE 115 point of view, the RNC 120 acts as a serving RNC 120 in which it terminates the UE's 115 link layer communications. From a core network 125 point of view, the serving RNC 120 terminates the Iu for the UE 115. The serving RNC 120 also controls the admission of new UEs 115 or services attempting to use the core network 125 over its Iu interface.

For an air interface, UMTS often uses a wideband spread-spectrum mobile air interface known as Wideband Code Division Multiple Access (or W-CDMA). W-CDMA uses a direct sequence code division multiple access signaling method (or CDMA) to separate users. W-CDMA is a third generation standard for mobile communications. W-CDMA evolved from GSM (Global System for Mobile Communications)/GPRS a second generation standard, which is oriented to voice communications with limited data capability. The first commercial deployments of W-CDMA are based on a version of the standards called W-CDMA Release 99.

The Release 99 specification defines two techniques to enable uplink packet data. Most commonly, data transmission is supported using either the Dedicated Channel (DCH) or the Random Access Channel (RACH). However, the DCH is the primary channel for support of packet data services. Each UE 115 uses an orthogonal variable spreading factor (OVSF) code. An OVSF code is an orthogonal code that facilitates uniquely identifying individual communication channels. In addition, micro diversity is supported using soft handover, and closed loop power control is employed with the DCH.

Pseudorandom noise (PN) sequences are commonly used in CDMA systems for spreading transmitted data, including transmitted pilot signals. The time required to transmit a single value of the PN sequence is known as a chip, and the rate at which the chips vary is known as the chip rate. Inherent in the design of direct sequence CDMA systems is that a receiver aligns its PN sequences to those of the Node Bs 105. Some systems, such as those defined by the W-CDMA standard, differentiate Node Bs 105 using a unique PN code for each, known as a primary scrambling code. The W-CDMA standard defines two Gold code sequences for scrambling the downlink, one for the in-phase component (I) and another for the quadrature (Q). The I and Q PN sequences together are broadcast throughout the cell without data modulation. This broadcast is referred to as the common pilot channel (CPICH). The PN sequences generated are truncated to a length of 38,400 chips. The period of 38,400 chips is referred to as a radio frame. Each radio frame is divided into 15 equal sections referred to as slots. W-CDMA Node Bs 105 operate asynchronously in relation to each other, so knowledge of the frame timing of one Node B 105 does not translate into knowledge of the frame timing of any other Node B 105. In order to acquire this knowledge, W-CDMA systems use synchronization channels and a cell searching technique.

Node Bs 105 may Turbo encode data to be transmitted to and decoded by UEs 115. A Turbo encoder may be defined as a code formed from the parallel concatenation of two or more codes separated by an interleaver. In many implementations, the two encoders used are identical, the code is in a systematic form (the input bits also occur in the output), and the interleaver reads the bits in a pseudo-random order. UEs 115 may also Turbo encode data to be transmitted to and decoded by Node Bs 105.

3GPP Release 5 and later supports High-Speed Downlink Packet Access (HSDPA). 3GPP Release 6 and later supports High-Speed Uplink Packet Access (HSUPA). HSDPA and HSUPA are sets of channels and procedures that enable high-speed packet data transmission on the downlink and uplink, respectively. Release 7 HSPA+ uses three enhancements to improve data rate. First, it introduces support for MIMO on the downlink. Second, higher order modulation is introduced on the downlink. Third, higher order modulation is introduced on the uplink.

In HSUPA, the Node B 105 allows several UEs 115 to transmit at a certain power level at the same time. These grants are assigned to users by using a fast scheduling algorithm that allocates the resources on a short-term basis (every tens of ms). The rapid scheduling of HSUPA is well suited to the bursty nature of packet data. During periods of high activity, a user may get a larger percentage of the available resources, while getting little or no bandwidth during periods of low activity.

In 3GPP Release 5 HSDPA, a Node B 105 of an access network sends downlink payload data to UEs 115 on High Speed Downlink Shared Channel (HS-DSCH), and the control information associated with the downlink data on High Speed Shared Control Channel (HS-SCCH). There are, in some examples, 256 Orthogonal Variable Spreading Factor (OVSF or Walsh) codes used for data transmission. In HSDPA systems, these codes are partitioned into release 1999 (legacy system) codes that are typically used for cellular telephony (voice), and HSDPA codes that are used for data services. For each transmission time interval (TTI), the dedicated control information sent to an HSDPA-enabled UE 115 indicates to the device which codes within the code space will be used to send downlink payload data (data other than control data of the radio network) to the device, and the modulation that will be used for transmission of the downlink payload data.

With HSDPA operation, downlink transmissions to the UEs 115 may be scheduled for different transmission time intervals using a number of available HSDPA OVSF codes. For a given TTI, each UE 115 may be using one or more of the HSDPA codes, depending on the downlink bandwidth allocated to the device during the TTI.

In a MIMO system, there are N (# of transmitter antennas) by M (# of receiver antennas) signal paths from the transmit and the receive antennas, and the signals on these paths are not identical. MIMO creates multiple data transmission pipes. The pipes are orthogonal in the space-time domain. The number of pipes equals the rank of the system. Since these pipes are orthogonal in the space-time domain, they create little interference with each other. The data pipes are realized with proper digital signal processing by properly combining signals on the N×M paths. A transmission pipe does not correspond to an antenna transmission chain or any one particular transmission path.

Communication systems may use a single carrier frequency or multiple carrier frequencies. Each link may incorporate a different number of carrier frequencies. Furthermore, a UE 115 may be any data device that communicates through a wireless channel or through a wired channel, for example using fiber optic or coaxial cables. A UE 115 may be any of a number of types of devices including but not limited to a PC card, a compact flash, an external or internal modem, or a wireless or wireline phone.

UE 115 that has established an active traffic channel connection with one or more Node Bs 105 is called active UE 115, and is said to be in a traffic state. UE 115 that is in the process of establishing an active traffic channel connection with one or more Node Bs 105 is said to be in a connection setup state. The communication link through which the UE 115 sends signals to the Node Bs 105 is called an uplink 235. The communication link through which Node Bs 105 send signals to a UE 115 is called a downlink 240.

Figure 3:
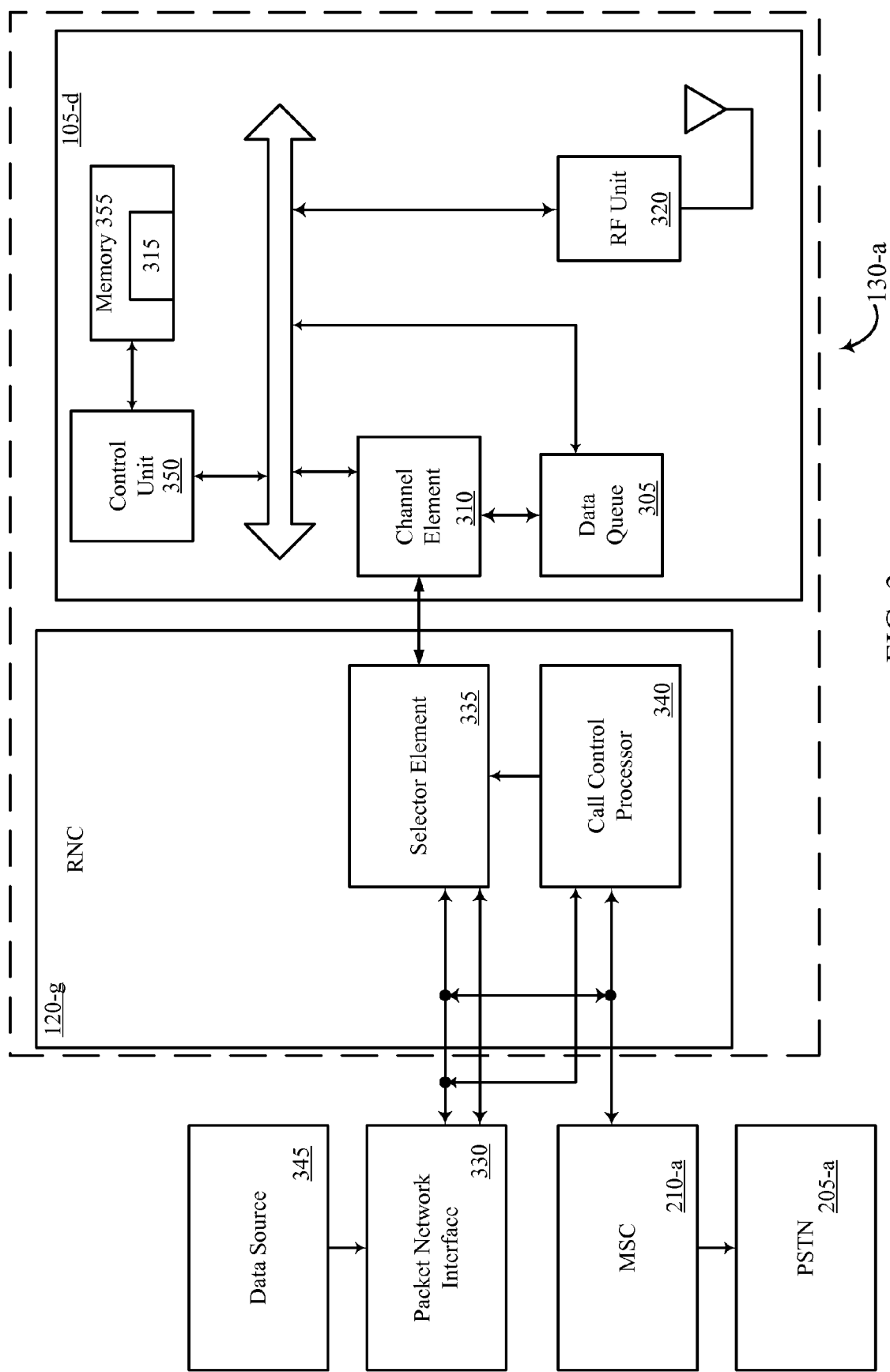
FIG. 3 is a block diagram of a portion of the communication system where a Node B and a radio network controller interface with a packet network interface.

FIG. 3 is detailed herein below, and provides an example wherein a Node B 105-*d* and RNC 120-*g* are in communication with a packet network interface 330. (In FIG. 3, only one of the Node Bs 105 and only one RNC 120 is shown for simplicity). The Node B 105-*d* and RNC 120-*g* may be part of a radio network 130-*a*, shown in FIG. 3 as a dotted line surrounding one or more Node Bs 105 and the RNC 120. The associated quantity of data to be transmitted is retrieved from a data queue 305 in the Node B 105-*d* and provided to the channel element 310 for transmission to the UE 115 associated with the data queue 305.

The RNC 120-*g* interfaces with the Public Switched Telephone Network (PSTN) 205-*a* through a mobile switching center 210-*a*. Also, RNC 120-*g* interfaces with Node Bs 105 in the radio network 100 (only one Node B 105 is shown in FIG. 3 for simplicity). In addition, the RNC 120-*g* interfaces with a packet network interface 330. The RNC 120-*g* coordinates the communication between the UE 115 in the radio network 100 and other users connected to packet network interface 330 and PSTN 205-*a*. The PSTN 205-*a* interfaces with users through a standard telephone network (not shown in FIG. 3).

The RNC 120-*g* contains many selector elements 335, although only one is shown in FIG. 3 for simplicity. Each selector element 335 is assigned to control communication between one or more Node Bs 105 and one UE 115 (not shown). If the selector element 335 has not been assigned to a given UE 115, a call control processor 340 is informed of the desire to page the UE 115. The call control processor 340 directs the Node B 105-*d* to page the UE 115.

Data source 345 contains a quantity of data which is to be transmitted to a given UE 115. The data source 345 provides the data to the packet network interface 330. The packet network interface 330 receives the data and routes the data to the selector element 335. The selector element 335 transmits the data to the Node B 105-*d* in communication with the target UE 115. In the examples, each Node B 105 maintains a data queue 305 which stores the data to be transmitted to the UE 115.

For each data packet, a channel element 310 inserts control fields. The channel element 310 performs a cyclic redundancy check, CRC, encoding (e.g., Turbo encoding) of the data packet and control fields, and inserts a set of code tail bits. The data packet, control fields, CRC parity bits, and code tail bits comprise a formatted packet. The channel element 310 encodes the formatted packet and interleaves (or reorders) the symbols within the encoded packet. The interleaved packet is covered with a Walsh code, and spread with the short PNI and PNQ codes. The spread data is provided to RF unit 320 which quadrature modulates, filters, and amplifies the signal. The downlink signal is transmitted over the air through an antenna to the downlink. The memory 355 of Node B 105-*d* may include random access memory (RAM) and read-only memory (ROM). The control unit 350 may be an intelligent hardware device, e.g., a central processing unit (CPU) such as those made by Intel® Corporation or AMD®, a microcontroller, an application specific integrated circuit (ASIC), etc. The Node B 105-*d* may store, e.g., in the memory 355, computer-readable, computer-executable software code 315 containing instructions that are configured to, when executed, cause the control unit 350 to perform Node B functionality described herein.

At the UE 115, the downlink signal is received by an antenna and routed to a receiver. The receiver filters, amplifies, quadrature demodulates, and quantizes the signal. The digitized signal is provided to a demodulator where the digitized signal is despread with the short PNI and PNQ codes and decovered with the Walsh cover. The demodulated data is provided to a decoder which performs the inverse of the signal processing functions done at the Node B 105-*d*, specifically the de-interleaving, decoding (e.g., Turbo decoding), and CRC check functions. The decoded data is provided to a data sink.

Figure 4:
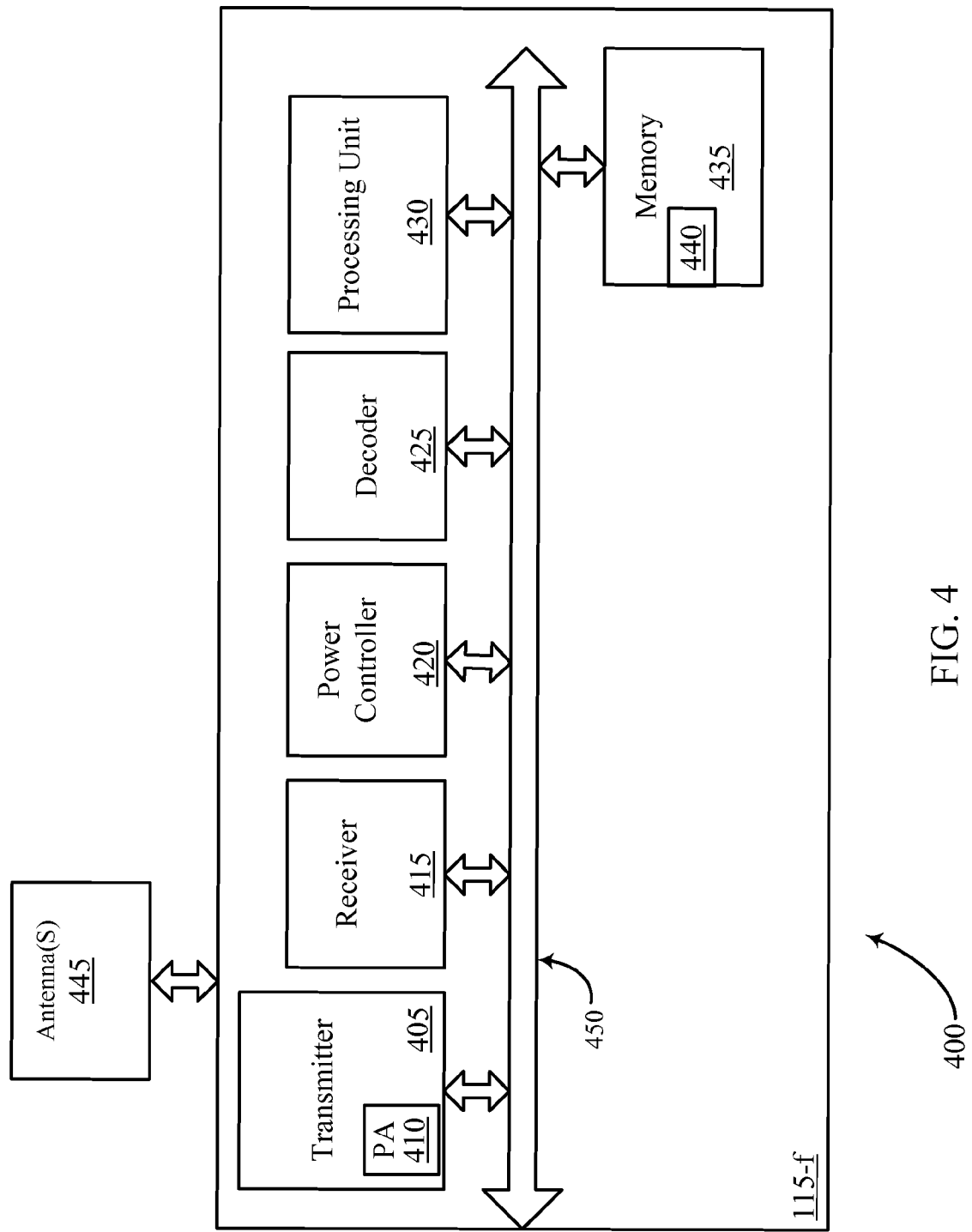
FIG. 4 is a block diagram of the baseband system for user equipment.

FIG. 4 illustrates an example 400 of a user equipment (UE) 115-*f* in which the UE 115-*f* includes transmitter circuitry 405 (including PA 410), receiver circuitry 415, power controller 420, decoder 425, a processing unit 430 for use in processing signals, memory 435, and one or more antennas 445. The transmitter 405 and the receiver 415 may allow transmission and reception of data, such as audio communications, between the UE 115-*f* and a remote location. The transmitter 405 and the receiver 415 are coupled with an antenna(s) 445.

The processing unit 430 controls operation of the UE 115. The processing unit 430 may also be referred to as a CPU. The memory 435, which may include both read-only memory (ROM) and random access memory (RAM), provides instructions and data to the processing unit 430. A portion of the memory 435 may also include non-volatile random access memory (NVRAM).

The various components of the UE 115 are coupled together by a bus system 450 which may include a power bus, a control signal bus, and a status signal bus in addition to a data bus. For the sake of clarity, the various busses are illustrated in FIG. 4 as the bus system 450.

The steps of the methods discussed may also be stored as instructions in the form of software or firmware 440 located in the memory 435 in the Node B 105. These instructions may be executed by the control unit 350 of Node B 105-*d* in FIG. 3. Alternatively, or in conjunction, the steps of the methods discussed may be stored as instructions in the form of software or firmware 440 located in the memory 435 in the UE 115. These instructions may be executed by the processing unit 430 of the UE 115 in FIG. 4.

Figure 5:
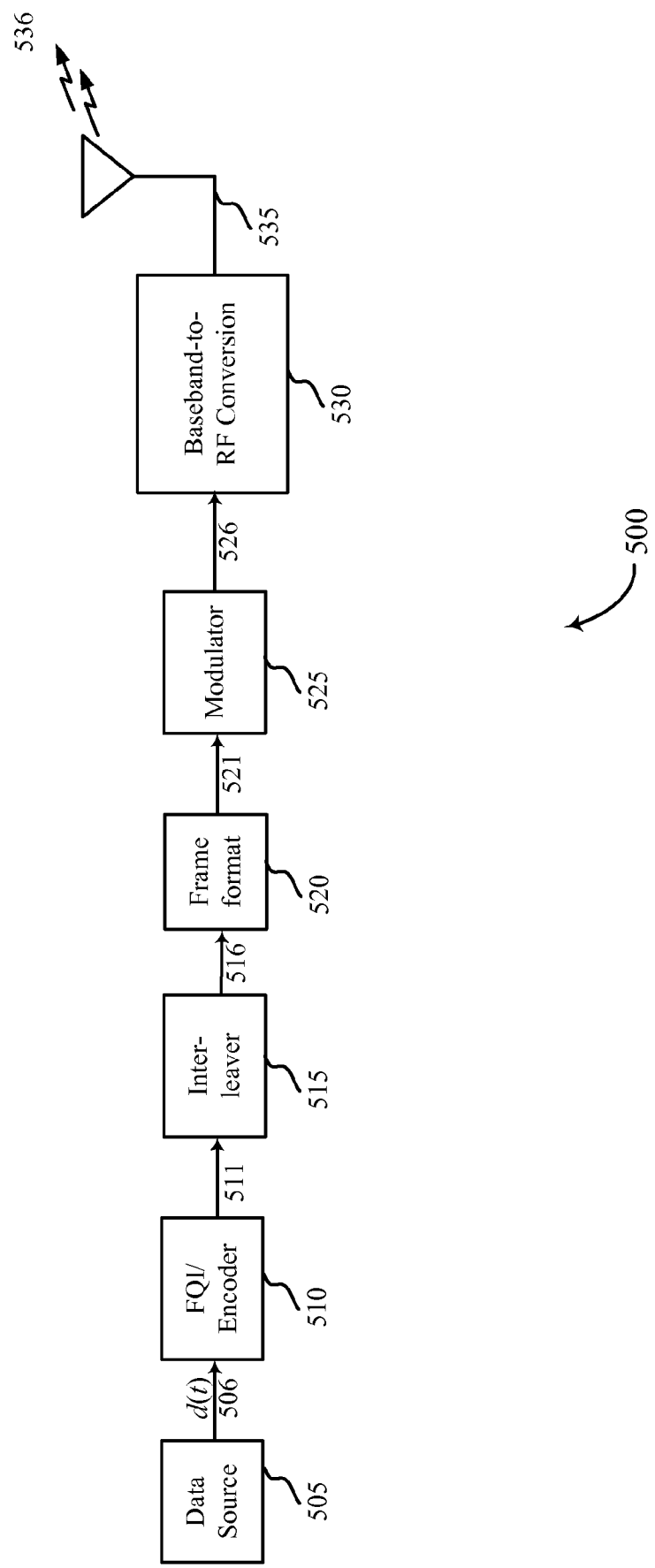
FIG. 5 is a functional block flow diagram of signals through structures of a transmitter.

FIG. 5 illustrates an example functional block flow diagram 500 for a transmission from a UE 115. A data source 505 provides data d(t) 506 to an FQI/encoder 510. The FQI/encoder 510 may append a frame quality indicator (FQI) such as a cyclic redundancy check (CRC) to the data d(t) 506. The FQI/encoder 510 may further encode the data and FQI using one or more coding schemes (e.g., Turbo encoding schemes) to provide encoded symbols 511. Each coding scheme may include one or more types of coding, e.g., convolutional coding, Turbo coding, block coding, repetition coding, other types of coding, or no coding at all. Other coding schemes may include automatic repeat request (ARQ), hybrid ARQ (H-ARQ), and incremental redundancy repeat techniques. Different types of data may be encoded with different coding schemes.

An interleaver 515 interleaves the encoded data symbols 511 in time to combat fading, and generates symbols 516. The interleaved symbols of signal 516 may be mapped by a frame format block 520 to a pre-defined frame format to produce a frame 521. A frame format may specify the frame as being composed of a plurality of sub-segments. Sub-segments may be any successive portions of a frame along a given dimension, e.g., time, frequency, code, or any other dimension. A frame may be composed of a fixed number of such sub-segments, each sub-segment containing a portion of the total number of symbols allocated to the frame. For example, according to the W-CDMA standard, a sub-segment may be defined as a slot. According to the cdma2000 standard, a sub-segment may be defined as a power control group (PCG). In one example, the interleaved symbols 516 are segmented into a plurality S of sub-segments making up a frame 521.

A frame format may further specify the inclusion of, e.g., control symbols (not shown) along with the interleaved symbols 516. Such control symbols may include, e.g., power control symbols, frame format information symbols, etc.

A modulator 525 modulates the frame 521 to generate modulated data 526. Examples of modulation techniques include binary phase shift keying (BPSK) and quadrature phase shift keying (QPSK). The modulator 525 may also repeat a sequence of modulated data.

A baseband-to-radio-frequency (RF) conversion block 530 may convert the modulated signal 526 to RF signals for transmission via one or more antenna(s) 535 as signal 536 over a wireless communication link to one or more Node Bs 105.

Turning now to a more specific discussion of Turbo decoding, assume that a Turbo encoded wireless signal is transmitted from a Node-B to a UE (e.g., from the Node-B 105 of FIG. 1 or 2 to a UE 115 of FIG. 1, 2, or 4, while noting that the direction may be reversed in other examples). A demodulator (e.g., in the receiver of FIG. 4) may perform FFT, channel estimation, demodulation, and deinterleaving functions on a digitized version of the received wireless signal, generating a series of information and parity symbols. In one example, a maximum a posteriori (MAP) decoding process is used. Therefore, decoder 425 of FIG. 4 may contain one or multiple MAP decoders. The MAP decoder is a SISO decoder that attempts to minimize the bit error of a code sequence. Aspects of the MAP decoding algorithm are presented in this section along with a version of the log-MAP algorithm.

A goal of the MAP decoder is to calculate the likelihood ratio of each bit in the message at time k, as shown in Equation 1, $$\lambda_k = \frac{Pr(u_k=1 \mid R_1^N)}{Pr(u_k=0 \mid R_1^N)} \qquad \text{Eq. 1}$$

where $u_k$ is the information bit at time k and $R_1^N$ is the received symbol sequence from time 1 to N where N is the length of the code block. Also, $R_k$ is defined as the combination of the received information symbol along with the parity symbols at time k.

If $S_k$ is the trellis state at time k:

$$\lambda_k^{i,m} = Pr(u_k=i, S_k=m \mid R_1^N) \qquad \text{Eq. 2}$$

the likelihood ratio may then be written as:

$$\lambda_k = \frac{\sum_m \lambda_k^{1,m}}{\sum_m \lambda_k^{0,m}} \qquad \text{Eq. 3}$$

Applying Bayes' Theorem, Equation 2 can be written as Equation 4, under the assumption of a memoryless channel:

$$\lambda_k^{i,m} = \frac{Pr(u_k=i, S_k=m, R_1^N)}{P(R_1^N)} \qquad \text{Eq. 4}$$

Expanding in Equation 5:

$$\lambda_k^{i,m} = \frac{Pr(R_1^{k-1} \mid u_k=i, S_k=m, R_k^N) \; Pr(R_{k+1}^N \mid u_k=i, S_k=m, R_k^N) \; Pr(d_k=i, S_k=m, R_k)}{Pr(R_1^N)} \qquad \text{Eq. 5}$$

Now Equation 5 can be broken down into three terms and labeled:

$$\alpha_k^m = Pr(R_1^{k-1} \mid u_k=i, S_k=m, R_k^N) = Pr(R_1^{k-1} \mid S_k=m) \qquad \text{Eq. 6}$$

$$\beta_k^{f(i,m)} = Pr(R_{k+1}^N \mid u_k=i, S_k=m, R_k) = Pr(R_{k+1}^N \mid S_k=f(i,m)) \qquad \text{Eq. 7}$$

$$\gamma_k^{i,m} = Pr(u_k=i, S_k=m, R_k) \qquad \text{Eq. 8}$$

Note that function f(i,m) is defined as the next state given input i and current state m. Having defined these terms, Equation 5 may now be written as:

$$\lambda_k^{i,m} = \frac{\alpha_k^m \beta_{k+1}^{f(i,m)} \gamma_k^{i,m}}{Pr(R_1^N)} \qquad \text{Eq. 9}$$

Equation 6 may now be defined as forward state metrics, Equation 7 may now be defined as reverse state metrics, and Equation 8 defined as the branch metrics. Equation 3 can now be rewritten as Equation 10 using the defined terms:

$$\lambda_k' = \frac{\sum_m \alpha_k^m \beta_{k+1}^{f(1,m)} \gamma_k^{1,m}}{\sum_m \alpha_k^m \beta_{k+1}^{f(0,m)} \gamma_k^{0,m}} \qquad \text{Eq. 10}$$

The next set of equations shows how the forward metrics may be recursively computed.

$$\alpha_k^m = Pr(R_1^{k-1} \mid S_k=m) \qquad \text{Eq. 11}$$

$$= \sum_{m'} \sum_{i=0}^{1} Pr(u_k=i, S_{k-1}=m', R_1^{k-1} \mid S_k=m)$$

$$= \sum_{m'} \sum_{i=0}^{1} Pr(R_1^{k-2} \mid S_k=m, u_{k-1}=i, S_{k-1}=m', R_{k-1})$$

$$Pr(u_{k-1}=i, S_{k-1}=m', R_{k-1} \mid S_k=m)$$

$$= \sum_{i=0}^{1} Pr(R_1^{k-2} \mid S_{k-1}=b(i,m))$$

$$Pr(u_{k-1}=i, S_{k-1}=b(i,m), R_{k-1})$$

$$= \sum_{i=0}^{1} \alpha_{k-1}^{b(j,m)} \gamma_{k-1}^{j,b(j,m)}$$

where b(i,m) is the state in the previous time index which transitions to m on a branch corresponding to i.

Similarly, the reverse state metrics can be recursively computed, leading to Equation 12:

$$\beta_k^m = \sum_{i=0}^{1} \beta_{k+1}^{f(i,m)} \gamma_k^{i,m} \qquad \text{Eq. 12}$$

Due to the extensive use of multiplication, the MAP decoding presented above does not readily translate into hardware. However, this can be transformed into the log domain by simply taking the logarithm of the functions. In the log domain, the hardware complex multiplications transform into additions, which the additions become the min* operation as defined in Equations 13-15:

$$\min^*(a,b) = -\log(e^{-a}+e^{-b}) = \min(a,b)+f(g) \qquad \text{Eq. 13}$$

$$f(g) = -\log(1+e^{-g}) \qquad \text{Eq. 14}$$

$$g=|a-b|\qquad\text{Eq. 15}$$

Equations 13-15 assume that the min* inputs are scaled such that they have a variance that is twice as large as their mean in absolute value.

The functions that were described in the previous section can now be shown in the following equations:

$$\Lambda_k=-\log(\lambda_k)\qquad\text{Eq. 16}$$

$$A_k^m=-\log(\alpha_k)\qquad\text{Eq. 17}$$

$$B_k^m=-\log(\beta_k)\qquad\text{Eq. 18}$$

$$\Gamma_k^{i,m}=-\log(\gamma_k^{i,m})\qquad\text{Eq. 19}$$

Substituting these new terms into the equations from the previous section, Equations 20-22 may now be derived as:

$$\Lambda_k=\min^*(A_k^m+B_k^{f(1,m)}+\Gamma_k^{1,m})-\min^*(A_k^m+B_k^{f(0,m)}+\Gamma_k^{0,m})\forall m\qquad\text{Eq. 20}$$

$$A_k^m=\min^*(A_{k-1}^{b(0,m)}+\Gamma_{k-1}^{0,b(0,m)},A_{k-1}^{b(1,m)}+\Gamma_{k-1}^{1,b(1,m)})\qquad\text{Eq. 21}$$

$$B_k^m=\min^*(B_{k+1}^{f(0,m)}+\Gamma_k^{0,f(0,m)},B_{k+1}^{f(1,m)}+\Gamma_k^{1,f(1,m)})\qquad\text{Eq. 22}$$

In addition, for the Turbo decoder, the log likelihood ratio can be broken up into its three components, the a priori probability, the a posteriori probability and the channel symbol information.

$$\Lambda_k=Z_k+Z'_k+Ax_k\qquad\text{Eq. 23}$$

The MAP algorithm may use both forward and backwards recursion through the code trellis to generate a pair of state metrics for each state in the trellis. A brute force method of implementing this algorithm is iterating forward through the trellis, storing all the forward state metrics, and then proceeding to iterate backwards through the code trellis to generate the other set of state metrics while simultaneously calculating the likelihood ratio. However, storing all the forward state metrics may take a significant amount of memory for even modest constraint length and block length codes. The use, of a Viterbi sliding window architecture (or other sliding window algorithm) may reduce the state metric storage. Sliding window architectures may be used, but are only one of a number of options.

One concept behind sliding window algorithms is that the reverse state metric calculation does not have to start from the last time step of the trellis. The reverse state metric calculation may be a recursive function that is based on the reverse state metrics from the next time step. In other words, it may be a backwards recursion through the trellis. Sliding window algorithms suggest that, for some length L and starting from some time point k in the trellis, reverse state metric calculations through L time steps produces a good approximation of the reverse state metrics at time step k-L. The next L reverse state metrics may then be calculated starting from the approximation at time k-L. So, since it is possible to build up good approximations of reverse state metrics starting from any point in the trellis, the storage requirement for forward state metrics may then be a function of L. The Viterbi sliding window architecture describes a sliding window architecture that requires a forward state metric storage of only 2L*2υ−1, where υ is the encoder constraint length. So, to prevent pipeline delays in the system, the VSWA calls two reverse state metric calculators.

Figure 6:
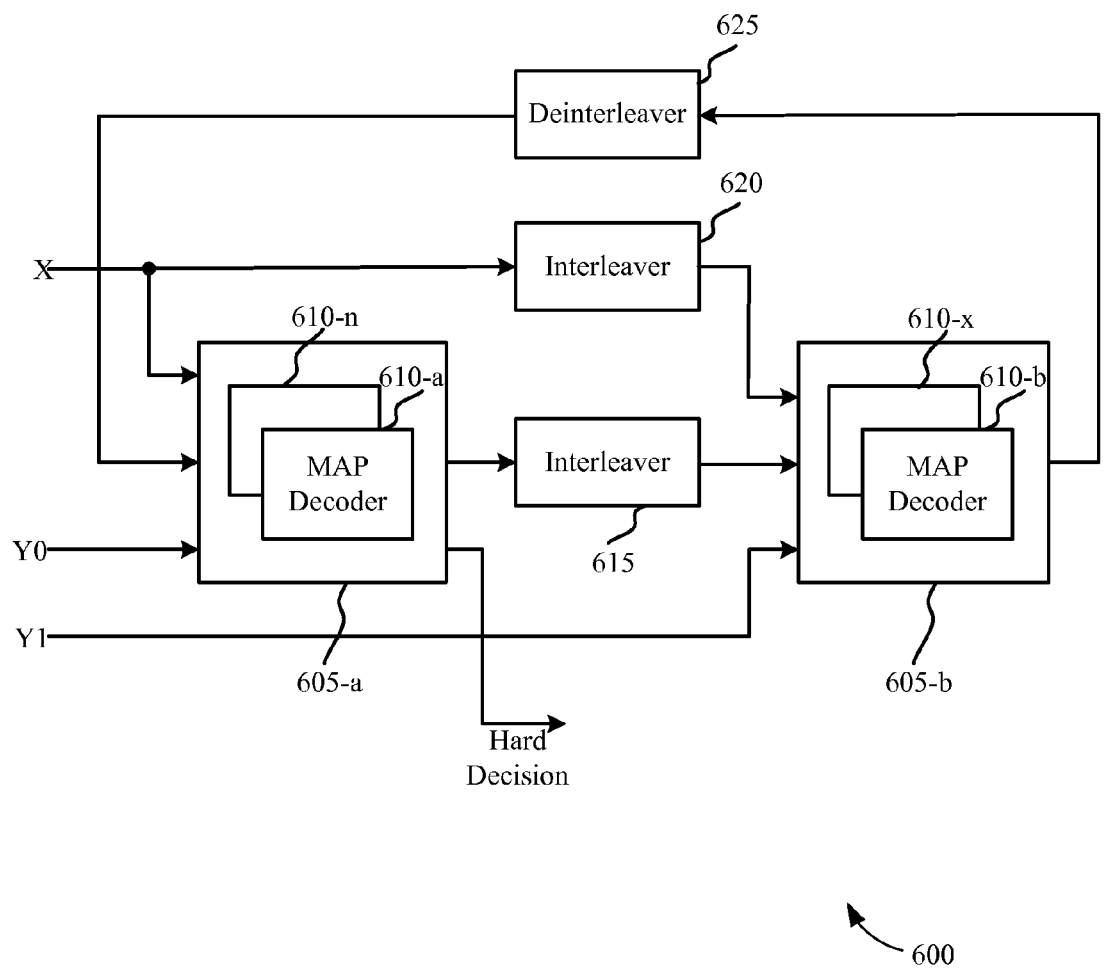
FIG. 6 is a block diagram of a recursive decoder.

Turning to FIG. 6, a block diagram illustrates an example architecture for a Turbo decoder 600. This Turbo decoder 600 may be implemented in the system 100 of FIG. 1 or system 200 of FIG. 2. More specifically, the decoder 600 may be implemented in the Node B 105 or UE 115 of FIG. 1, 2, 3, or 4. This Turbo decoder 600 may be the decoder 425 of FIG. 4.

The Turbo decoder 600 includes MAP decoder array 605-a, MAP decoder array 605-b, interleaver 615, interleaver 620, and deinterleaver 625, which each may be in communication with each other. Each MAP decoder array 605 may contain one or multiple MAP decoders, 610. These modules may, individually or collectively, be implemented with one or more Application Specific Integrated Circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each unit may also be implemented, in whole or in part, with instructions embodied in a memory, formatted to be executed by one or more general or application-specific processors.

In the sliding window example, the decoder 600 does not have to start at the beginning (or end) of the block to compute good forward (or reverse) state metrics. The decoder 600, therefore, may essentially split the block into two blocks (with some overlap of two sliding window lengths) and process them in parallel.

A MAP decoder 610 fetches information (X) and parity (Y) symbols, and previously calculated state metrics, and generates new state metrics. Generated state metrics may be continuously fed back to MAP decoders 610 (e.g., via interleavers 615, 620, and/or deinterleaver 625) to facilitate the recursive process. MAP decoder array 605 may calculate log-likelihood ratios, and generate hard decisions.

In the following section, a number of architectures are described. For FIGS. 7-10 it may be assumed that radix-4 decoding process is undertaken. The basic idea of radix-4 decoding is to step through the code trellis twice as fast. This is done by processing two sets of branch metrics and stepping through the forward and reverse trellises two steps at a time. Aspects of the decoding functionality described herein may be used for radix-2 decoding as well.

Figure 7:
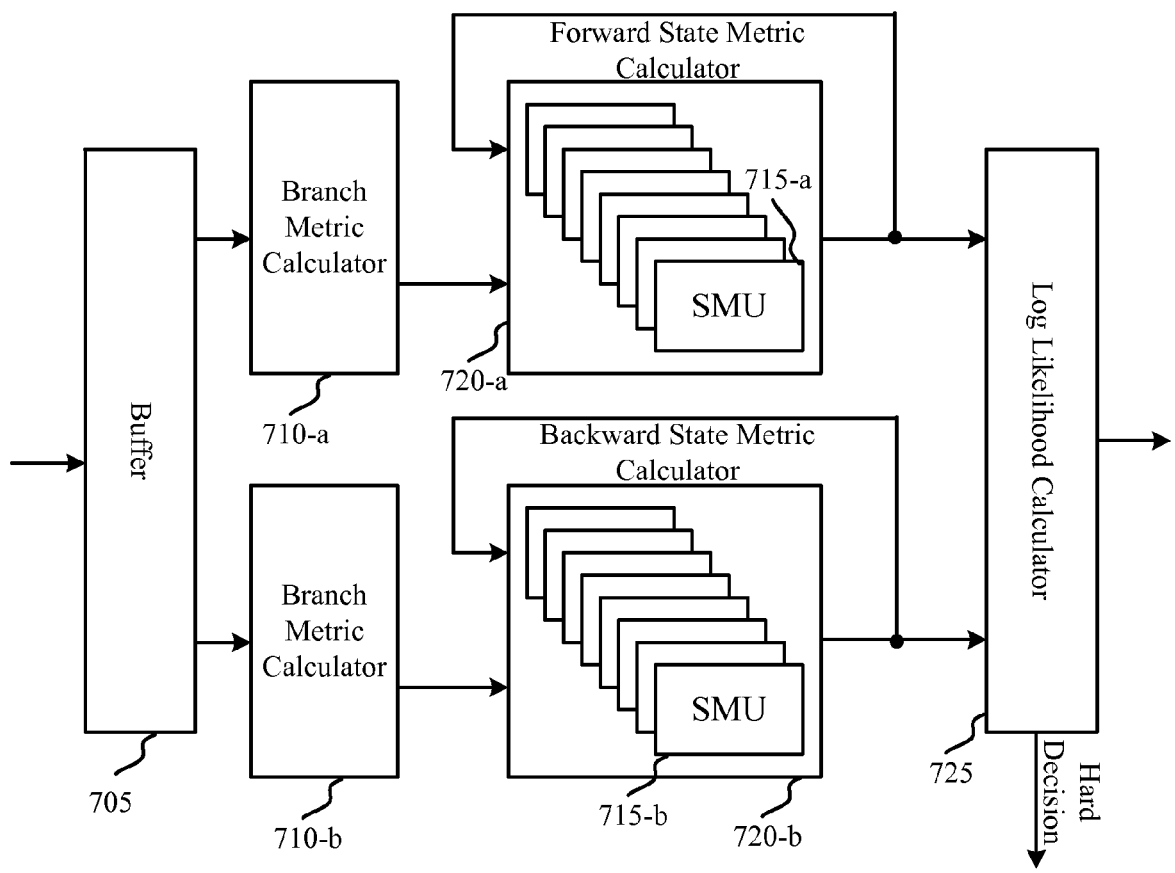
FIG. 7 is a block diagram of a Log-MAP decoder.

Turning to FIG. 7, a block diagram illustrates an example of a MAP decoder 700 module. This MAP decoder 700 module may be implemented in the system 100 of FIG. 1 or system 200 of FIG. 2. More specifically, the MAP decoder 700 module may be implemented in the Node B 105 or UE 115 of FIG. 1, 2, 3, or 4. This MAP decoder 700 module may be the MAP decoder array 605 of FIG. 6. In the following example, it may be assumed that the MAP decoder 700 module calculates forward state metrics. However, a like architecture may be used for reverse state metrics, as well.

The MAP decoder 700 module includes buffer 705, branch metric calculator 710-a and 710-b, forward state metric calculator 720-a, backward state metric calculator 720-b, and log-likelihood calculator 725. Each state metric calculator may contain one or multiple state metric units 715-a and 715-b. These components may, individually or collectively, be implemented with one or more Application Specific Integrated Circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art.

The buffer 705 may receive and store information and parity symbols from a demodulated wireless signal, and the symbols are fetched by a branch metric calculator 710. In one example, a branch metric calculator 710 is responsible for calculating all of the possible radix-4 branches for each time index. Since the branch metric operation is not recursive like the state metric calculation, it is possible to break the operation into two pipeline stages. In the first stage, all possible radix-2 branch metrics are computed for each of the two segments that comprise the radix-4 branch. In the second stage, the radix-2 branch metrics are combined into the radix-4 branch metric.

Equation 22 is the branch metric formula, where $x_k$ is the soft-input information symbol, $y_k^0$ is the first soft-input parity symbol, $y_k^1$ is the second soft-input parity symbol, and $z_k$ is the a priori probability. The variable i is the possible information hypothesis (−1 for 1 and +1 for 0) and the variable $c^{n,i,m}$ is the parity hypothesis for parity bit n, given the input i and encoder state m. The parity hypothesis is also represented as −1 for 1 and +1 for 0.

$$\Gamma_k^{i,m} = \max(0, (x_k + z_k) \cdot i) + \max(0, y_k^0 \cdot c^{0,i,m}) + \max(0, y_k^1 \cdot c^{1,i,m})$$ Eq. 24

The branch metric equation uses the convention that the lowest symbol metrics (i.e., 0) have the highest probability. The second stage combines the radix-2 branch metrics to produce radix-4 branch metrics.

In one example, a state metric unit 715-*a* fetches the combined branch metrics and previously calculated forward state metrics (e.g., fed back from a state metric unit, as described above). The combined branch metrics and previously calculated forward state metrics are used by the state metric unit 715-*a* to create new state metrics. The forward state metric calculator 720-*a* computes new forward state metrics. The backward state metric calculator 720-*b* may similarly compute new backward state metrics. These new state metrics may be fetched by the log-likelihood calculator 725, and used to compute the LLR (a soft-decision for each information bit).

Figure 8:
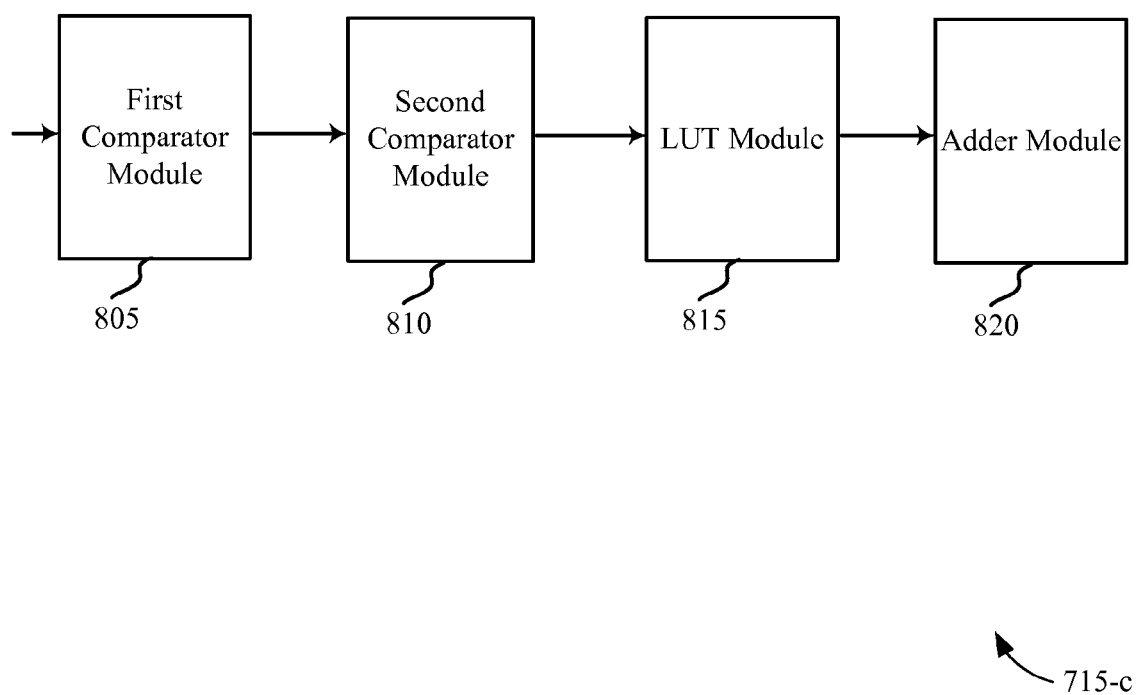
FIG. 8 is a block diagram of components of an SMU.

Turning to FIG. 8, a block diagram illustrates an example of a state metric unit 715-*c* module. This state metric unit 715-*c* module may be state metric unit 715-*a* of FIG. 7. The state metric unit 715-*c* module includes a first comparator module 805, a second comparator module 810, a LUT module 815, and an adder module 820.

A set of branch metrics and a previously calculated set of state metrics are received by the state metric unit 715-*c*. The first comparator module 805 may fetch the set of previously calculated state metrics, and compare different subsets of the set of state metrics. The first comparator module 805 may select one or more of the compared subsets before the set of branch metrics is added to portions of the received state metrics. In an example using radix-4 decoding, two comparisons are made concurrently during a first stage, and the subset with the larger value is selected in each case.

The comparisons of the first comparator module 805 may be used to identify which portions of the received set of state metrics are to be added to the branch metrics, and which portions of the of received set of state metrics are to be eliminated from consideration from being added to the branch metrics. The selected subsets may each be added to portions of the branch metrics, while the unselected subsets may be eliminated from consideration.

In one example, the second comparator module 810 compares each selected subset (e.g., of the two selected subsets for the radix-4 decoding example above), and identifies a winner. In one example, the second comparator module 810 operates during the second stage. The second comparator module 810 may include adder functionality, and each selected subset may be added with portions of the branch metrics during the second stage (i.e., concurrently with the comparison of the second comparator module 810). In another example, the second comparator module 810 selects a winning state metric subset during the second stage and before any of the set of branch metrics is added to the set of state metrics. The winning subset selected by the comparator module 810 may be used to determine which portions of the received set of state metrics are to be added to the received set of branch metrics. In one example, the winning subset is added to portions of the branch metrics.

A LUT module 815 may be used to generate a normalization metric during a third stage of processing. The LUT module 815 may include adder functionality, and the winning subset may be added with portions of the branch metrics during the third stage (contrasted with being added during the second stage, as above. An adder module 820 may add a normalization factor to the winning subset and to combined state and branch metrics, and output a new set of state metrics.

Figure 9:
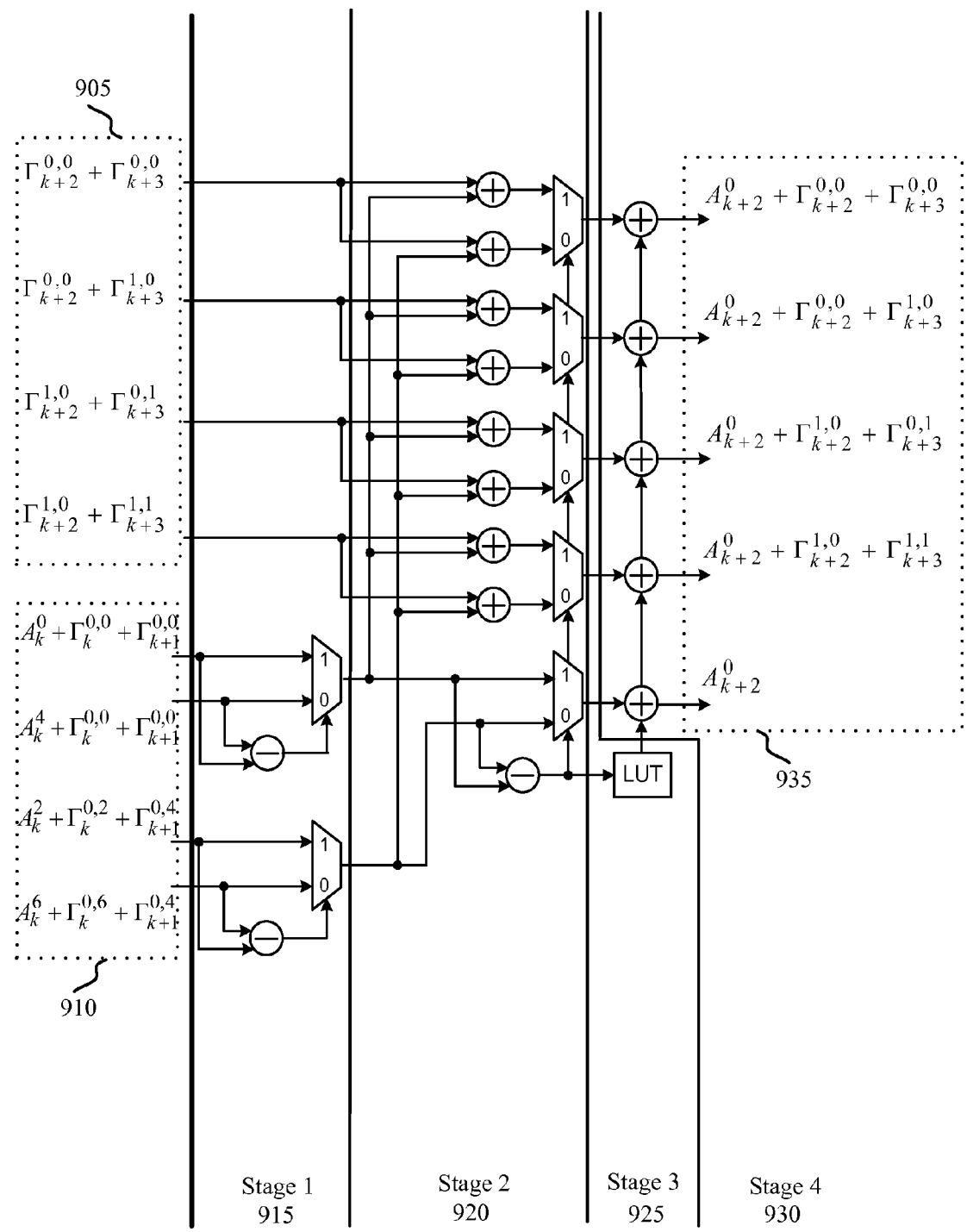
FIG. 9 is a block diagram of an SMU radix-4 architecture.

Turning to FIG. 9, a circuit diagram illustrates an example of a state metric unit 715-*d* module. This state metric unit 715-*d* module may be state metric unit 715 of FIG. 7 or 8. It may be assumed that this state metric unit 715-*d* is performing radix-4 processing, A set of branch metrics 905 and a previously calculated set of state metrics 910 are received by the state metric unit 715-*d*. In the illustrated example, there are four subsets of state metrics. During a first stage 915, different subsets of the set of state metrics 910 are compared to identify which subset has a higher value. Two of the compared subsets are selected. During a second stage 920, the two selected subsets are compared. This comparison during the second stage 920 occurs concurrently with eight adding operations (both subsets of state metrics selected during the first stage 915 are added with four of the received branch metrics). Thus, the eight adding operations occur after the second stage 920 comparison, the selected subsets are used in the adding operations, and the unselected subsets are eliminated from consideration, based on the comparison.

The comparison during the second stage 920 dictates which subset of the state metrics is to be selected (based on which of the compared two subsets has a higher value). The selected subset of state metrics also dictates which four results of the eight adder operations of stage two 920 are to be selected. During a third stage 925, normalization metrics are generated (to apply a scale factor). During a fourth stage 930, the normalization metrics are added to the state metric selected at stage two and the 4 selected branch/state metric combinations from stage two 920. A new set of state metrics 935 for a new time index are then generated from the processing during the fourth stage 930. A portion of this new set of state metrics 935 may be fed back to the beginning part of the state metric unit 715-*b* for processing with new branch metrics.

Figure 10:
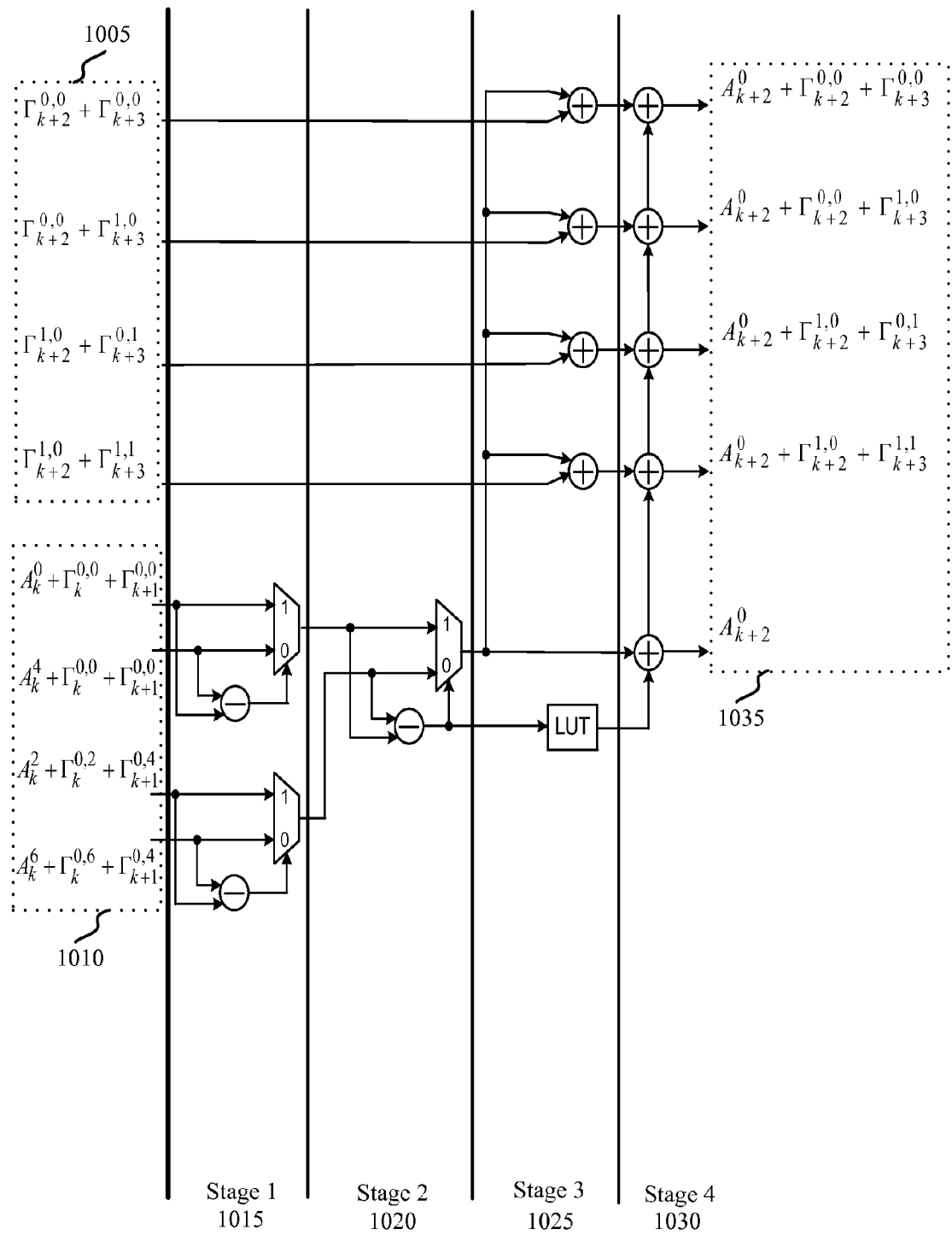
FIG. 10 is a block diagram of an alternative SMU radix-4 architecture.

Turning to FIG. 10, a circuit diagram illustrates an example of a state metric unit 715-*e* module. This state metric unit 715-*e* module may be state metric unit 715 of FIG. 7 or 8. It may be assumed that this state metric unit 715-*e* is performing radix-4 processing.

A set of branch metrics 1005 and a previously calculated set of state metrics 1010 are received by the state metric unit 715-*e*. In the illustrated example, there are four subsets of state metrics, and four subsets of branch metrics. During a first stage 1015, different subsets of the set of state metrics 1010 are compared to identify which subset has a higher value. Two of the compared subsets are selected. During a second stage 1020, the two selected subsets are compared.

The comparison during the second stage 1020 dictates which subset of the state metrics is to be selected (based on which of the compared two subsets has a higher value). During a third stage 1025, the subset of state metrics selected during the second stage 1020 is added to each of the four subsets of branch metrics 1005. These adding operations occur after the first stage 1015 and second stage 1020 comparisons; the selected subset of state metrics from the second stage 1020 is used in each of the four adding operations of the third stage 1025, and the unselected subsets from the first stage 1015 and second stage 1020 are eliminated from consideration, based on the comparisons. Also during the third stage 1025, normalization metrics are generated (to apply a scale factor). During a fourth stage 1030, the normalization metrics are added to the state metric selected at stage two 1020 and the four branch/state metric combinations are calculated at stage three 1025. A new set of state metrics 1035 for a new time index are then generated from the processing during the fourth stage 1030. A portion of this new set of state metrics 1035 may be fed back to beginning part of the state metric unit 715-c for processing with new branch metrics.

Figure 11:
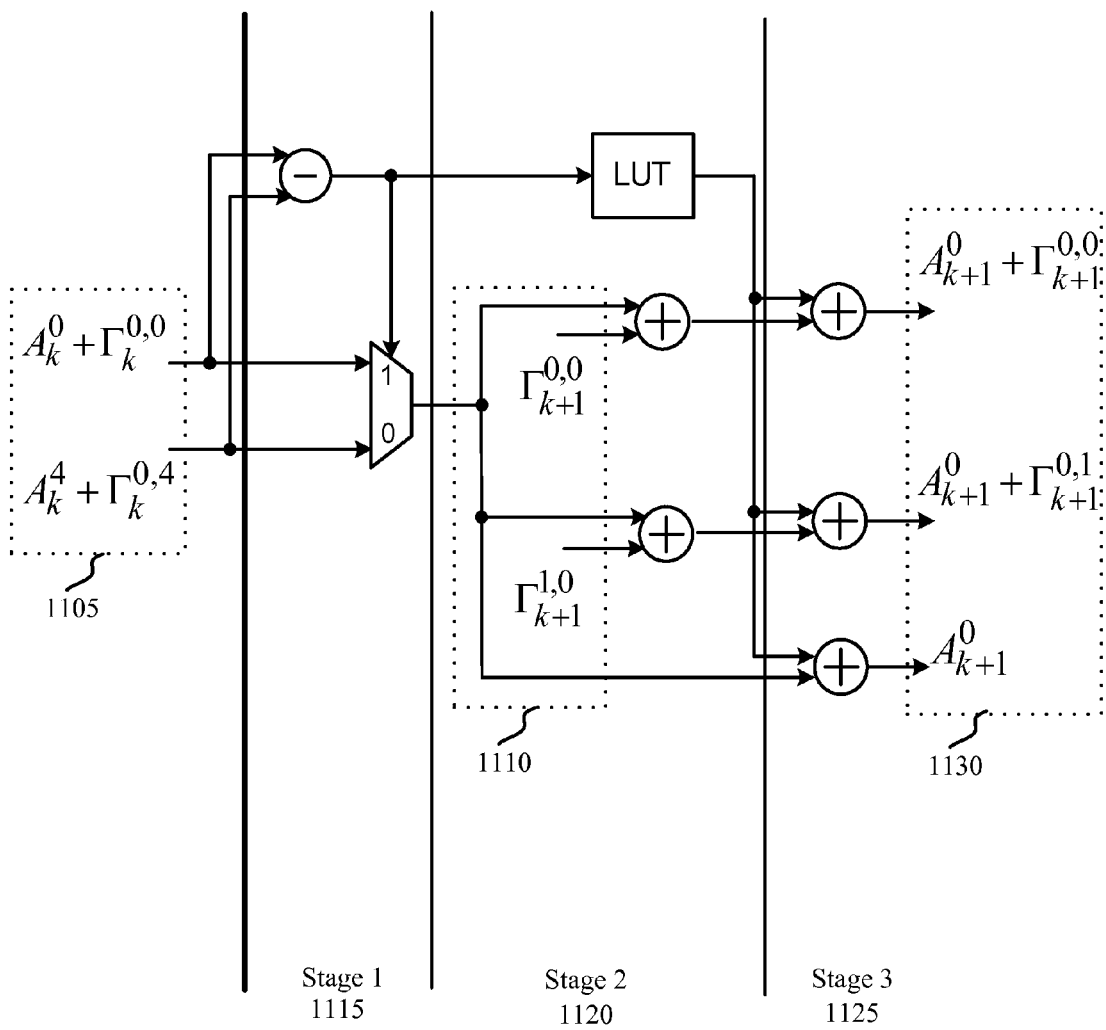
FIG. 11 is a block diagram of an SMU radix-2 architecture.

Turning to FIG. 11, a circuit diagram illustrates an example of a state metric unit 715-f module. This state metric unit 715-f module may be state metric unit 715 of FIG. 7 or 8. It may be assumed that this state metric unit 715-f is performing radix-2 processing, A set of branch metrics 1105 and a previously calculated set of state metrics 1110 are received by the state metric unit 715-c. In the illustrated example, there are two subsets of state metrics 1105 and two subsets of branch metrics 1110. During a first stage 1115, subsets of the set of state metrics 1110 are compared to identify which subset has a higher value. One of the compared subsets is selected. During a second stage 1120, a normalization metric is generated. This generation during the second stage 1120 occurs concurrently with two adding operations (the subset selected during stage one 1115 is added with the two received branch metrics 1110). Thus, the two adding operations occur after the second stage 1120 comparison; the selected subset is used in the adding operations, and the unselected subset is eliminated from consideration.

During a third stage 1125, the normalization metrics are added to the state metric selected at stage one 1115 and the two branch/state metric combinations from stage two 1120. A new set of state metrics 1130 for a new time index are generated from the processing during the third stage 1125. A portion of this new set of state metrics 1130 may be fed back to beginning part of the state metric unit 715-f for processing with new branch metrics.

Figure 12:
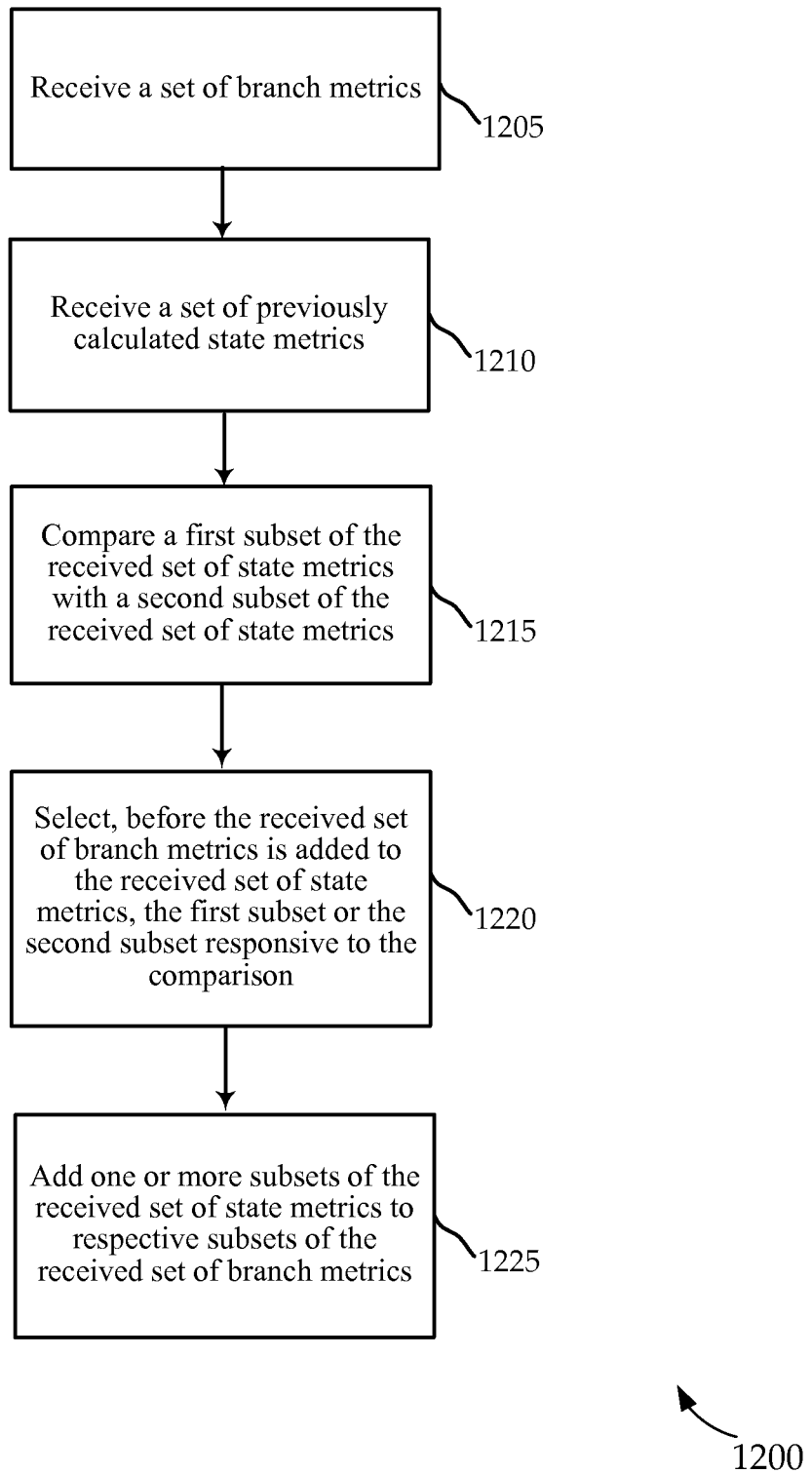
FIG. 12 is a flowchart illustrating a method of Turbo decoding.

Turning to FIG. 12, a flowchart illustrates a method 1200 of state metric processing. This method 1200 may be implemented in the system 100 of FIG. 1 or system 200 of FIG. 2. The method 1200 may be implemented in the Node B 105 or UE 115 of FIG. 1, 2, 3, or 4. More specifically, the method may implemented, in whole or in part, in the state metric unit 715 of FIG. 7, 8, 9, 10, or 11. The method 1200 may be implemented in other types of devices and systems, as well.

At block 1205, a set of branch metrics is received. At block 1210, a set of previously calculated state metrics is received. At block 1215, a first subset of the received set of state metrics is compared with a second subset of the received set of state metrics. At block 1220, before the received set of branch metrics is added to the received set of state metrics, the first subset or the second subset is selected responsive to the comparison. At block 1225, one or more subsets of the received set of state metrics is added to respective subsets of the received set of branch metrics.

Figure 13:
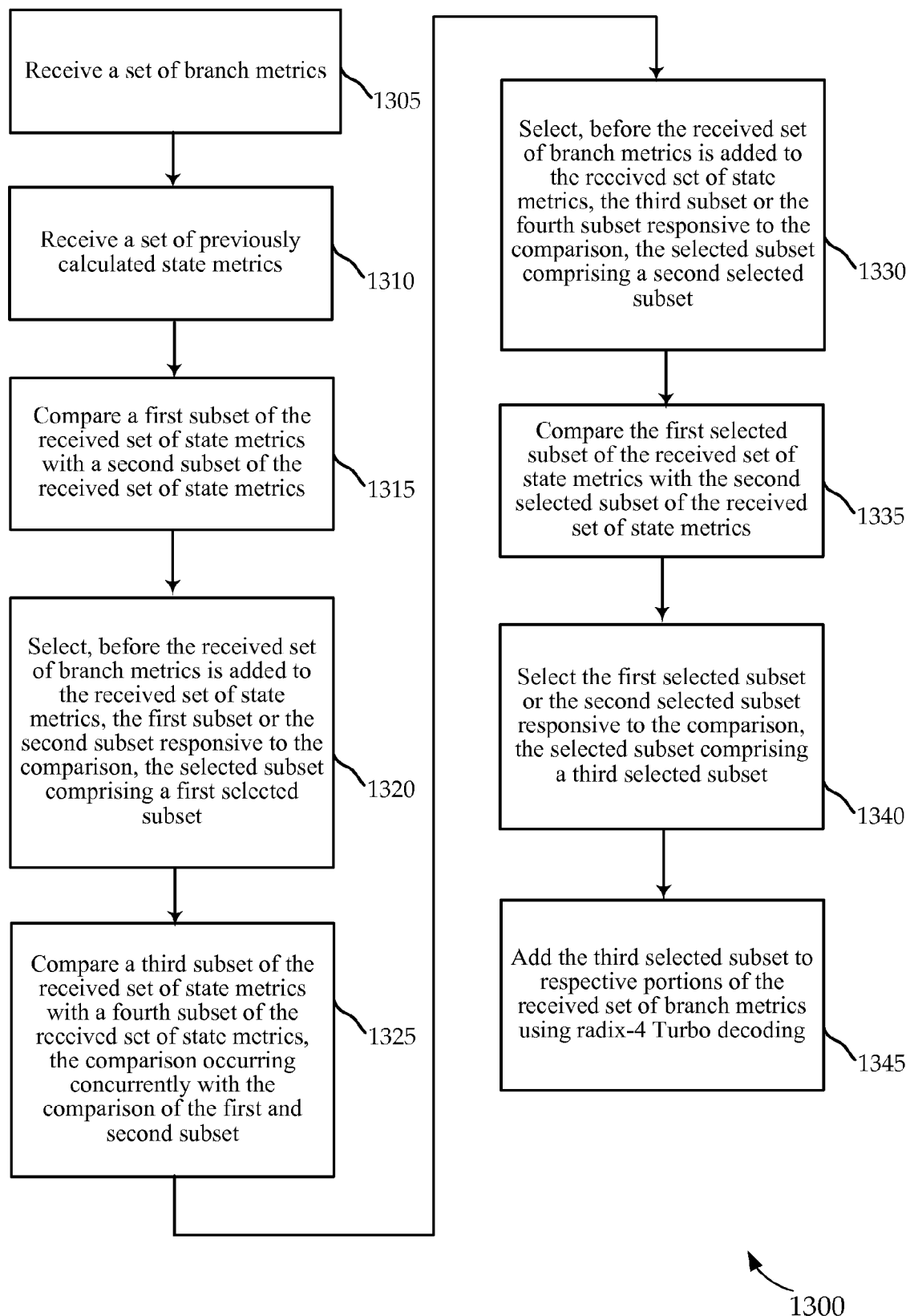
FIG. 13 is a flowchart illustrating an method of Turbo decoding using a Radix-4 SMU.

Referring next to FIG. 13, a flowchart illustrates a method 1300 of state metric processing. This method 1300 may be implemented in the system 100 of FIG. 1 or system 200 of FIG. 2. The method 1300 may be implemented in the Node B 105 or UE 115 of FIG. 1, 2, 3, or 4. More specifically, the method may implemented, in whole or in part, in the state metric unit 715 of FIG. 7, 8, 9, 10, or 11. The method 1200 may be implemented in other types of devices and systems, as well.

At block 1305, a set of branch metrics is received. At block 1310, a set of previously calculated state metrics is received. At block 1315, a first subset of the received set of state metrics is compared with a second subset of the received set of state metrics. At block 1320, before the received set of branch metrics is added to the received set of state metrics, the first subset or the second subset is selected responsive to the comparison, the selected subset comprising a first selected subset.

At block 1325, a third subset of the received set of state metrics is compared with a fourth subset of the received set of state metrics, the comparison occurring concurrently with the comparison of the first and second subset. At block 1330, before the received set of branch metrics is added to the received set of state metrics, the third subset or the fourth subset is selected responsive to the comparison, the selected subset comprising a second selected subset.

At block 1335, the first selected subset of the received set of state metrics is compared with the second selected subset of the received set of state metrics. At block 1340, the first selected subset or the second selected subset is selected responsive to the comparison, the selected subset comprising a third selected subset. At block 1345, the third selected subset is added to the respective portions of the received set of branch metrics using radix-4 Turbo decoding.

Figure 14:
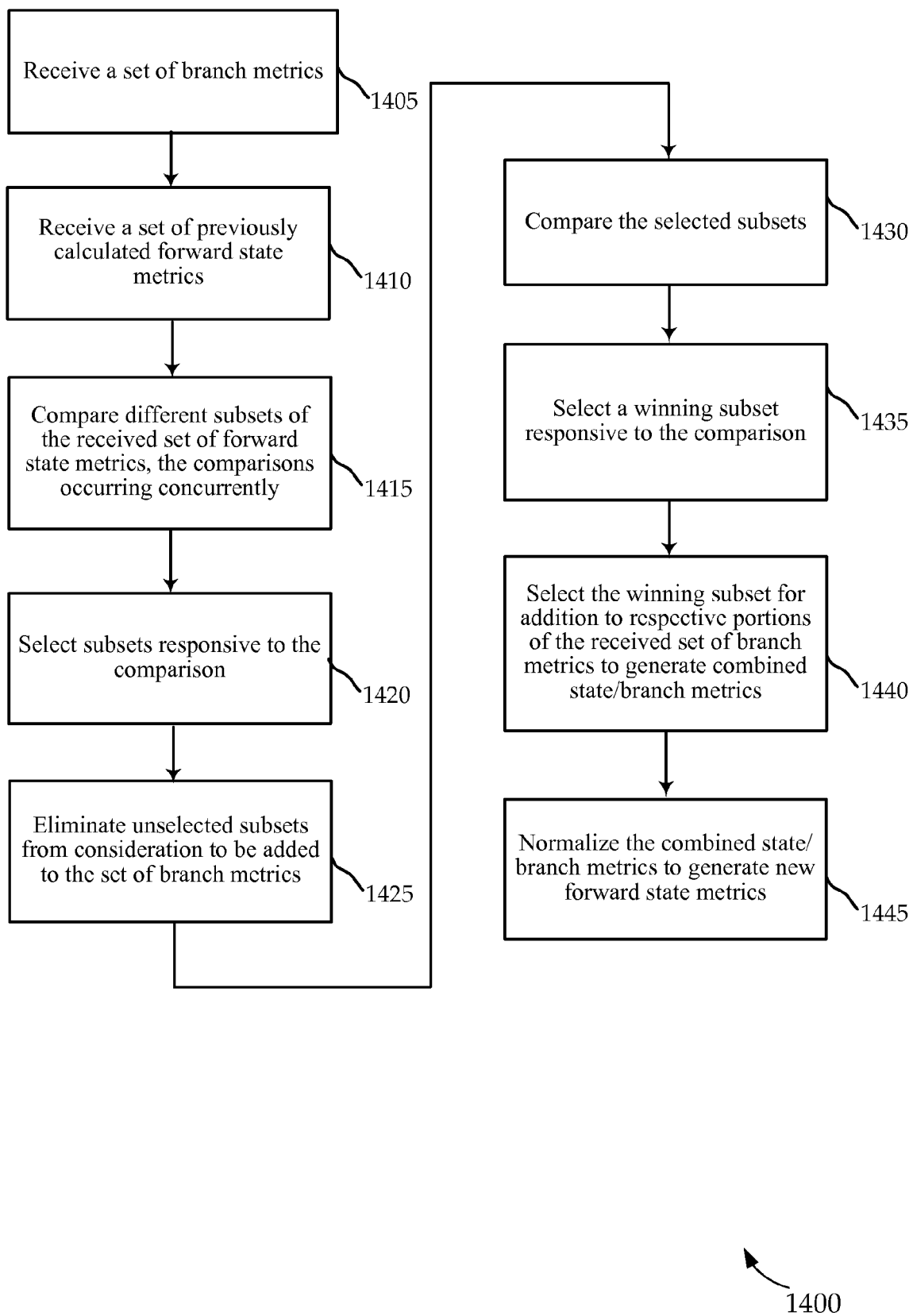
FIG. 14 is a flowchart illustrating an alternative method of Turbo decoding.

Turning to FIG. 14, a flowchart illustrates a method 1400 of state metric processing. This method 1400 may be implemented in the system 100 of FIG. 1 or system 200 of FIG. 2. The method 1400 may be implemented in the Node B 105 or UE 115 of FIG. 1, 2, 3, or 4. More specifically, the method may implemented, in whole or in part, in the state metric unit 715 of FIG. 7, 8, 9, 10, or 11. The method 1400 may be implemented in other types of devices and systems, as well.

At block 1405, a set of branch metrics is received. At block 1410, a set of previously calculated forward state metrics is received. At block 1415, different subsets of the received set of forward state metrics are compared, the comparisons occurring concurrently. At block 1420, subsets are selected responsive to the comparison. At block 1425, unselected subsets are eliminated from consideration to be added to the set of branch metrics.

At block 1430, the selected subsets are compared. At block 1435, a winning subset is selected responsive to the comparison. At block 1440, the winning subset is selected for addition to respective portions of the received set of branch metrics to generate combined state/branch metrics. At block 1445, the combined state/branch metrics are normalized to generate new forward state metrics.

Considerations Regarding the Description

The detailed description set forth above in connection with the appended drawings describes examples and does not represent the only architectures that may be implemented or that are within the scope of the claims. The detailed description includes specific details for the purpose of providing a thorough understanding of the described techniques. These techniques, however, may be practiced without these specific details. In some instances, well-known structures and devices are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks, servers, and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the spirit or scope of the disclosure. Throughout this disclosure the term "example" or "exemplary" indicates an example or instance and does not imply or require any preference for the noted example. Thus, the disclosure is not to be limited to the examples and designs described herein but is to be accorded the widest scope consistent with the principles and novel features disclosed herein.

What is claimed is:

1. A method for Turbo decoding with state metric computations, the method comprising:
receiving a set of branch metrics;
receiving a set of previously calculated state metrics;
comparing a first subset of the received set of state metrics with a second subset of the received set of state metrics;
selecting, before the received set of branch metrics is added to the received set of state metrics, the first subset or the second subset responsive to the comparison, the selected subset comprising a first selected subset; and
adding one or more subsets of the received set of state metrics identified by the first selected subset to respective subsets of the received set of branch metrics.

2. The method of claim 1, further comprising:
utilizing the first selected subset to identify which subsets of the received set of state metrics are to be added to the received set of branch metrics,
wherein the identified subsets of the received set of state metrics comprise the one or more subsets.

3. The method of claim 1, further comprising:
utilizing the first selected subset to eliminate subsets of the received set of state metrics from being added to the received set of branch metrics.

4. The method of claim 1, further comprising:
utilizing, responsive to the selection, the first selected subset as the portion of the received set of state metrics to add to the received set of branch metrics.

5. The method of claim 1, further comprising:
eliminating an unselected subset as a portion of the of received set of state metrics to add to the received set of branch metrics.

6. The method of claim 1, further comprising:
comparing a third subset of the received set of state metrics with a fourth subset of the received set of state metrics; and
selecting, before the received set of branch metrics is added to the received set of state metrics, a second selected subset from the third subset or the fourth subset responsive to the comparison,
wherein the comparison of the first subset and second subset and the comparison of the third subset and fourth subset occur concurrently.

7. The method of claim 6, further comprising:
comparing the first selected subset and the second selected subset; and
selecting, before the received set of branch metrics is added to the received set of state metrics, a third selected subset from the first selected subset or the second selected subset responsive to the comparison.

8. The method of claim 7, further comprising:
utilizing the third selected subset to determine which subsets of the received set of state metrics are to be added to the received set of branch metrics.

9. The method of claim 8, further comprising:
eliminating the first selected subset or the second selected subset as a portion of the received set of state metrics to add to the received set of branch metrics, the elimination responsive to the selection of the third selected subset.

10. The method of claim 6, wherein the Turbo decoding comprises forward state metric computations using a radix-4 decoder.

11. The method of claim 1, wherein the Turbo decoding comprises radix-2 state metric computations.

12. An apparatus for Turbo decoding with state metric computations, the apparatus comprising:
- a branch metric calculator configured to calculate a set of branch metrics; and
- a state metric unit, communicatively coupled with the branch metric calculator, and configured to:
  - calculate a set of state metrics;
  - receive the set of branch metrics and the calculated set of state metrics;
  - compare a first subset of the received set of state metrics with a second subset of the received set of state metrics;
  - select, before the received set of branch metrics is added to the received set of calculated state metrics, the first subset or the second subset responsive to the comparison, the selected subset comprising a first selected subset; and
  - add one or more subsets of the received set of state metrics identified by the first selected subset to respective subsets of the received set of branch metrics.

13. The apparatus of claim 12, wherein the state metric unit is further configured to:
- utilize the first selected subset to determine which subsets of the received set of state metrics are to be added to the received set of branch metrics.

14. The apparatus of claim 12, wherein the state metric unit is further configured to:
- utilize the first selected subset to eliminate subsets of the received set of state metrics from consideration for being added to the received set of branch metrics.

15. The apparatus of claim 12, wherein the state metric unit is further configured to:
- compare a third subset of the received set of state metrics with a fourth subset of the received set of state metrics; and
- select, before the received set of branch metrics is added to the received set of state metrics, a second selected subset from the third subset or the fourth subset responsive to the comparison,
- wherein the comparison of the first subset and second subset and the comparison of the third subset and fourth subset occur concurrently.

16. The apparatus of claim 15, wherein the state metric unit is further configured to:
- compare the first selected subset and the second selected subset; and
- select, before the received set of branch metrics is added to the received set of state metrics, a third selected subset from the first selected subset or the second selected subset responsive to the comparison.

17. The apparatus of claim 16, wherein the state metric unit is further configured to:
- utilize the third selected subset to determine which subsets of the received set of state metrics are to be added to respective portions of the received set of branch metrics.

18. The apparatus of claim 16, wherein the state metric unit is further configured to:
- utilize the selection of the third selected subset to eliminate a subset of the received set of state metrics from consideration for being added to respective subsets of the received set of branch metrics.

19. The apparatus of claim 16, wherein the state metric unit comprises:
- a first comparator module configured to compare different subsets of the received set of state metrics to identify and select subsets of higher value;
- a second comparator module to compare different subsets selected by the first comparator module to identify and select a winning subset of higher value;
- a LUT module to generate normalization metrics; and
- an adder module to add normalization metrics to respective combinations of the winning subset and the branch metrics, and thereby calculate new state metrics.

20. The apparatus of claim 16, wherein the state metric unit is further configured to:
- utilize the first selected subset to generate forward or reverse state metrics.

21. The apparatus of claim 12, further comprising:
- a log likelihood calculator, communicatively coupled with the state metric unit, and configured to receive forward and reverse state metrics from the state metric unit to generate soft-decisions for each time index.

22. The apparatus of claim 12, wherein,
- the apparatus comprises an access terminal; and
- the apparatus comprises a plurality of forward state calculators and a plurality of reverse state calculators, the state metric unit comprising a selected one of the plurality of forward state calculators or reverse state calculators.

23. The apparatus of claim 12, further comprising:
- one or more antennas configured to receive a wireless communication signal; and
- a receiver, coupled with the one or more antennas, and configured to:
  - digitize the received wireless communication signal; and
  - demodulate the digitized wireless communication signal to generate a series of soft symbols for processing by the branch metric calculator.

24. The apparatus of claim 12, wherein the apparatus comprises a radix-4 decoder.

25. The method of claim 1, wherein the apparatus comprises a radix-2 decoder.

26. A device for Turbo decoding with state metric computations, the device comprising:
- means for receiving a set of branch metrics;
- means for receiving a set of previously calculated state metrics;
- means for comparing a first subset of the received set of state metrics with a second subset of the received set of state metrics;
- means for selecting, before the received set of branch metrics is added to the received set of state metrics, the first subset or the second subset responsive to the comparison, the selected subset comprising a first selected subset; and
- means for adding one or more subsets of the received set of state metrics identified by the first selected subset to respective subsets of the received set of branch metrics.

27. The device of claim 26, further comprising:
- means for adding the first selected subset to respective portions of the received set of branch metrics, wherein an unselected subset is eliminated from consideration as a portion of the of received set of state metrics to be added to respective subsets of the received set of branch metrics.

28. The device of claim 27, wherein the device comprises a radix-2 circuit.

29. The device of claim 26, further comprising:
- means for comparing a third subset of the received set of state metrics with a fourth subset of the received set of state metrics;
- means for selecting, before the received set of branch metrics is added to the received set of state metrics, a second selected subset from the third subset or the fourth subset responsive to the comparison; and means for adding the second selected subset to combined branch metrics of the received set of branch metrics, wherein the unselected third subset or fourth subset is eliminated from consideration as a portion of the of received set of state metrics to be added to the received set of branch metrics.

30. The device of claim 29, further comprising:

means for comparing the first selected subset and the second selected subset; and means for selecting a third selected subset from the first selected subset or the second selected subset responsive to the comparison, wherein the device comprises a radix-4 circuit.

31. A computer program product, comprising a non-transitory computer readable medium, comprising
  code for causing a computer to turbo decode with state metric computations, comprising instructions to:
    receive a set of branch metrics;
    receive a set of previously calculated state metrics;
    compare a first subset of the received set of state metrics with a second subset of the received set of state metrics;
    select, before the received set of branch metrics is added to the received set of state metrics, the first subset or the second subset responsive to the comparison, the selected subset comprising a first selected subset; and
    add one or more subsets of the received set of state metrics identified by the first selected subset to respective subsets of the received set of branch metrics.

32. The computer program product of claim 31 further comprising instructions to:

compare a third subset of the received set of state metrics with a fourth subset of the received set of state metrics;

select, before the received set of branch metrics is added to the received set of state metrics, a second selected subset from the third subset or the fourth subset responsive to the comparison;

compare the first selected subset and the second selected subset;

select a third selected subset from the first selected subset or the second selected subset responsive to the comparison; and add the third selected subset to each of a plurality of combined branch metrics of the set of branch metrics, the third selected subset comprising the one or more subsets of the received set of state metrics.

* * * * *